United States Patent
Hardin et al.

(10) Patent No.: US 9,564,272 B2
(45) Date of Patent: Feb. 7, 2017

(54) CONTINUOUS EXTRUSION METHOD FOR MANUFACTURING A Z-DIRECTED COMPONENT FOR INSERTION INTO A MOUNTING HOLE IN A PRINTED CIRCUIT BOARD

(71) Applicant: Lexmark International, Inc., Lexington, KY (US)

(72) Inventors: Keith Bryan Hardin, Lexington, KY (US); Zachary Charles Nathan Kratzer, Lexington, KY (US); Qing Zhang, Lexington, KY (US)

(73) Assignee: Lexmark International, Inc., Lexington, KY (US)

(*) Notice: Subject to any disclaimer, the term of this patent is extended or adjusted under 35 U.S.C. 154(b) by 0 days.

(21) Appl. No.: 14/574,903

(22) Filed: Dec. 18, 2014

(65) Prior Publication Data

US 2015/0101742 A1 Apr. 16, 2015

Related U.S. Application Data

(62) Division of application No. 13/284,084, filed on Oct. 28, 2011, now Pat. No. 8,943,684.

(51) Int. Cl.
  *H05K 3/30* (2006.01)
  *H01G 4/33* (2006.01)
  (Continued)

(52) U.S. Cl.
  CPC .............. *H01G 4/33* (2013.01); *H01G 4/35* (2013.01); *H05K 1/0231* (2013.01); *H05K 1/184* (2013.01);
  (Continued)

(58) Field of Classification Search
  CPC .... H05K 1/0231; H05K 1/184; H05K 1/0306; H01L 2924/01079; H01L 2924/3011; H01L 23/49811; Y10T 29/4913
  (Continued)

(56) References Cited

U.S. PATENT DOCUMENTS 2,005,582 A * 6/1935 Given ............... H02G 15/12
                                                    178/46
2,064,649 A * 12/1936 Doran ............... F01D 25/00
                                                    165/67

(Continued)

FOREIGN PATENT DOCUMENTS

| CN | 1900358 A | 1/2007 |
|----|-----------|--------|
| DE | 3906268 A1 | 8/1990 |

(Continued)

OTHER PUBLICATIONS

Prosecution history of copending U.S. Appl. No. 13/528,097 including Notice of Allowance dated Dec. 31, 2014.

(Continued)

*Primary Examiner* — Paul D Kim
(74) *Attorney, Agent, or Firm* — Justin M. Tromp

(57) ABSTRACT

A method for manufacturing a Z-directed component for insertion into a mounting hole in a printed circuit board according to one example embodiment includes simultaneously extruding a plurality of materials according to the structure of the Z-directed component to form an extruded object and forming the Z-directed component from the extruded object. In one embodiment, the extruded object is divided into individual Z-directed components. In one embodiment, the timing of extrusion between predetermined sections of one of the materials is varied in order to stagger the sections in the extruded object.

11 Claims, 21 Drawing Sheets

(51) Int. Cl.
*H05K 1/18* (2006.01)
*H01G 4/35* (2006.01)
*H05K 1/02* (2006.01)
*H05K 3/40* (2006.01)

(52) U.S. Cl.
CPC .............. *H05K 3/30* (2013.01); *H05K 1/0221* (2013.01); *H05K 1/0251* (2013.01); *H05K 1/0298* (2013.01); *H05K 3/4046* (2013.01); *H05K 2201/10053* (2013.01); *H05K 2201/10984* (2013.01); *Y10T 29/4913* (2015.01); *Y10T 29/49135* (2015.01)

(58) Field of Classification Search
USPC .......... 29/832, 835; 174/255, 256, 260, 267; 361/763
See application file for complete search history.

(56) References Cited

U.S. PATENT DOCUMENTS

| | | | | |
|---|---|---|---|---|
| 2,188,667 A * | 1/1940 | Stoekle | H01B 1/18 | 252/506 |
| 3,142,783 A * | 7/1964 | Warren | H05K 1/184 | 174/260 |
| 3,148,356 A * | 9/1964 | Hedden, Jr. | H01R 12/526 | 174/260 |
| 3,219,886 A * | 11/1965 | Katzin | H01R 23/68 | 361/730 |
| 3,377,611 A * | 4/1968 | Pawl | H01R 4/2429 | 439/406 |
| 3,545,079 A * | 12/1970 | Kossar | H01G 2/00 | 174/255 |
| 3,652,971 A * | 3/1972 | Bugg | H01R 39/00 | 439/10 |
| 3,666,160 A * | 5/1972 | Gwyn, Jr. | B21K 1/62 | 228/3.1 |
| 3,691,326 A * | 9/1972 | Grossman | H01H 19/001 | 200/11 TW |
| 3,798,394 A * | 3/1974 | Stokes | H01H 13/70 | 200/11 R |
| 3,923,359 A | 12/1975 | Newsam | | |
| 3,996,440 A * | 12/1976 | Niconienko | H01H 19/585 | 200/277 |
| 4,109,295 A * | 8/1978 | Rostek | H01G 2/06 | 361/303 |
| 4,109,296 A * | 8/1978 | Rostek | H01G 2/06 | 361/303 |
| 4,147,579 A * | 4/1979 | Schade | H01L 21/4807 | 156/252 |
| 4,199,209 A * | 4/1980 | Cherian | H01R 12/714 | 439/515 |
| 4,356,230 A | 10/1982 | Emanuel et al. | | |
| 4,381,134 A * | 4/1983 | Anselmo | H01R 12/585 | 439/444 |
| 4,446,505 A * | 5/1984 | Long | H01R 12/585 | 361/784 |
| 4,532,152 A | 7/1985 | Elarde | | |
| 4,543,715 A * | 10/1985 | Iadarola | H05K 3/403 | 174/261 |
| 4,561,486 A * | 12/1985 | Maeda | C30B 11/00 | 117/924 |
| 4,642,588 A * | 2/1987 | Kameya | H03H 7/345 | 333/139 |
| 4,654,472 A * | 3/1987 | Goldfarb | H01L 23/055 | 174/260 |
| 4,654,749 A * | 3/1987 | Kanai | H01G 4/012 | 29/25.42 |
| 4,675,625 A * | 6/1987 | Johnston | H01P 9/00 | 333/161 |
| 4,700,155 A * | 10/1987 | Sakamoto | H03H 1/0007 | 333/182 |
| 4,711,015 A * | 12/1987 | Tega | H05K 13/0443 | 140/105 |
| 4,735,753 A * | 4/1988 | Ackermann | A41H 37/04 | 156/580.1 |
| 4,775,326 A * | 10/1988 | Lenaerts | H01R 12/585 | 439/751 |
| 4,789,346 A * | 12/1988 | Frantz | H01R 12/716 | 439/599 |
| 4,832,746 A * | 5/1989 | Yachi | C04B 28/02 | 106/640 |
| 4,850,892 A * | 7/1989 | Clayton | H01R 12/721 | 439/326 |
| 4,913,863 A * | 4/1990 | Burrafato | B29C 47/003 | 264/177.17 |
| 5,010,945 A * | 4/1991 | Burke | B22F 3/1275 | 164/101 |
| 5,147,985 A * | 9/1992 | DuBrucq | H01L 23/58 | 174/250 |
| 5,166,096 A * | 11/1992 | Cote | H01L 21/3105 | 257/752 |
| 5,167,513 A | 12/1992 | Johnson et al. | | |
| 5,240,671 A | 8/1993 | Carey | | |
| 5,274,916 A | 1/1994 | Kawabata | | |
| 5,344,343 A * | 9/1994 | Seidler | H01R 12/57 | 29/846 |
| 5,406,444 A * | 4/1995 | Selfried | H01B 17/28 | 174/152 GM |
| 5,528,080 A | 6/1996 | Goldstein | | |
| 5,603,847 A * | 2/1997 | Howard | H05K 1/162 | 216/17 |
| 5,650,759 A * | 7/1997 | Hittman | H03H 1/0007 | 333/182 |
| 5,669,789 A * | 9/1997 | Law | H01R 13/7195 | 333/12 |
| 5,708,569 A * | 1/1998 | Howard | H05K 1/162 | 361/760 |
| 5,760,336 A * | 6/1998 | Wang | H01C 1/024 | 174/535 |
| 5,783,026 A * | 7/1998 | Natarajan | B32B 38/1841 | 156/378 |
| 5,792,293 A | 8/1998 | Inasaka | | |
| 5,851,865 A * | 12/1998 | Koike | H01L 21/823807 | 257/E21.633 |
| 5,858,145 A * | 1/1999 | Sreeram | B32B 37/0023 | 156/182 |
| 5,870,921 A * | 2/1999 | Piccinin | B21C 25/00 | 72/269 |
| 5,952,723 A * | 9/1999 | Takeyasu | H01L 21/76802 | 257/771 |
| 6,045,615 A * | 4/2000 | Buechele | H05K 3/1233 | 118/300 |
| 6,068,782 A * | 5/2000 | Brandt | H05K 1/162 | 216/13 |
| 6,153,290 A * | 11/2000 | Sunahara | H01L 21/4857 | 156/89.16 |
| 6,165,864 A * | 12/2000 | Shen | H01L 28/82 | 257/E21.012 |
| 6,206,718 B1 | 3/2001 | Takahashi et al. | | |
| 6,319,018 B1* | 11/2001 | Daoud | H01R 9/096 | 439/65 |
| 6,329,715 B1* | 12/2001 | Hayashi | H01L 23/15 | 257/528 |
| 6,331,930 B1 | 12/2001 | Kuroda et al. | | |
| 6,362,438 B1 | 3/2002 | Chong et al. | | |
| 6,375,880 B1 | 4/2002 | Cooper et al. | | |
| 6,388,208 B1* | 5/2002 | Kiani | H05K 1/0222 | 174/260 |
| 6,581,276 B2* | 6/2003 | Chung | H01Q 1/38 | 257/E25.013 |
| 6,593,535 B2* | 7/2003 | Gailus | H01R 12/523 | 174/255 |
| 6,735,855 B2* | 5/2004 | Akram | H01R 13/2421 | 29/739 |
| 6,747,217 B1* | 6/2004 | Jochym | H01R 12/58 | 174/265 |
| 6,754,551 B1* | 6/2004 | Zohar | B41J 2/01 | 228/43 |
| 6,825,748 B1 | 11/2004 | Ibata et al. | | |

(56) References Cited

U.S. PATENT DOCUMENTS

| | | | | |
|---|---|---|---|---|
| 6,870,252 B2* | 3/2005 | Novak | H01L 23/50 | 257/691 |
| 6,920,673 B2* | 7/2005 | Allen | A61N 1/3754 | 29/25.03 |
| 6,948,943 B2* | 9/2005 | Li | H01R 31/08 | 439/65 |
| 6,950,066 B2* | 9/2005 | Hendler | H01Q 9/36 | 343/700 MS |
| 6,983,535 B2* | 1/2006 | Crockett | H05K 1/0231 | 174/262 |
| 7,101,730 B2* | 9/2006 | Bolken | H01L 25/105 | 257/E25.023 |
| 7,238,892 B2* | 7/2007 | Bois | H05K 1/0242 | 174/260 |
| 7,416,985 B2* | 8/2008 | Yamamoto | H01L 21/76807 | 257/E21.579 |
| 7,458,151 B2* | 12/2008 | Onodera | H01L 23/4828 | 257/E21.514 |
| 7,486,498 B2* | 2/2009 | Welsch | H01G 9/04 | 361/508 |
| 7,509,856 B1* | 3/2009 | Winkens | G01F 23/265 | 73/304 C |
| 7,525,814 B2* | 4/2009 | Yuri | H01L 21/4857 | 361/306.3 |
| 7,599,191 B2* | 10/2009 | Shinaberger | H01G 2/06 | 361/760 |
| 7,663,064 B2* | 2/2010 | Dutta | H05K 1/024 | 174/255 |
| 7,791,203 B2 | 9/2010 | Boon et al. | | |
| 7,820,479 B2* | 10/2010 | Sakaguchi | B23K 1/0016 | 257/E21.229 |
| 7,843,056 B2* | 11/2010 | Smeys | H01L 21/4853 | 257/415 |
| 7,888,599 B2* | 2/2011 | Kim | H05K 1/162 | 174/250 |
| 7,891,980 B2* | 2/2011 | Frasco | H05K 1/023 | 439/65 |
| 7,969,745 B2* | 6/2011 | Hsu | H01L 23/50 | 174/255 |
| 8,000,763 B2* | 8/2011 | Mazza | A61B 5/151 | 600/345 |
| 8,039,951 B2* | 10/2011 | Kanth | H01L 21/565 | 257/706 |
| 8,094,429 B2* | 1/2012 | Hsu | H01G 4/1209 | 361/301.4 |
| 8,115,113 B2* | 2/2012 | Tanaka | H05K 1/162 | 174/260 |
| 2001/0012036 A1* | 8/2001 | Giere | B41J 2/1412 | 347/62 |
| 2001/0051388 A1 | 12/2001 | Shiozaki et al. | | |
| 2002/0086188 A1* | 7/2002 | Halsey, IV | C03C 17/3417 | 428/697 |
| 2002/0117330 A1* | 8/2002 | Eldridge | B23K 20/004 | 174/260 |
| 2003/0051910 A1* | 3/2003 | Dyke | H01L 23/49822 | 174/262 |
| 2003/0081370 A1* | 5/2003 | Haskell | H01G 4/35 | 361/306.1 |
| 2003/0101585 A1* | 6/2003 | Pearson | H05K 1/113 | 29/854 |
| 2003/0222288 A1 | 12/2003 | Schaper | | |
| 2004/0121266 A1* | 6/2004 | Lee | H05K 1/162 | 430/313 |
| 2004/0242082 A1* | 12/2004 | Tsuchiya | H01R 12/585 | 439/751 |
| 2005/0112831 A1 | 5/2005 | Surdeanu | | |
| 2005/0128680 A1* | 6/2005 | Shin | H01G 4/1227 | 361/306.3 |
| 2005/0156319 A1* | 7/2005 | Oggioni | H01L 23/49827 | 257/774 |
| 2005/0237137 A1 | 10/2005 | Dutta | | |
| 2006/0009038 A1* | 1/2006 | Cohen | B81C 1/00611 | 438/697 |
| 2006/0043572 A1 | 3/2006 | Sugimoto et al. | | |
| 2006/0046468 A1 | 3/2006 | Akram et al. | | |
| 2006/0054352 A1* | 3/2006 | Ryu | H05K 1/185 | 174/260 |
| 2006/0071795 A1 | 4/2006 | Benedikt | | |
| 2006/0137907 A1* | 6/2006 | Chheda | H05K 1/0222 | 174/262 |
| 2006/0139845 A1 | 6/2006 | Hiramatsu et al. | | |
| 2006/0145800 A1* | 7/2006 | Dadafshar | H01F 27/2847 | 336/82 |
| 2006/0215380 A1* | 9/2006 | Lu | H01G 4/232 | 361/763 |
| 2006/0234023 A1 | 10/2006 | Endou et al. | | |
| 2006/0243581 A1* | 11/2006 | Nishimoto | H01H 19/58 | 200/520 |
| 2006/0266549 A1* | 11/2006 | Lin | H05K 1/0216 | 174/262 |
| 2006/0274479 A1 | 12/2006 | Radhakrishnan et al. | | |
| 2006/0276325 A1 | 12/2006 | Pinceloup et al. | | |
| 2006/0278072 A1* | 12/2006 | Kent | A61M 25/0021 | 95/43 |
| 2006/0286696 A1* | 12/2006 | Peiffer | H05K 1/16 | 438/27 |
| 2007/0051594 A1* | 3/2007 | Schwarz | G05G 1/015 | 200/11 R |
| 2007/0085125 A1* | 4/2007 | Inoue | H01L 21/76849 | 257/301 |
| 2007/0099513 A1* | 5/2007 | Savage | B29C 45/14336 | 439/638 |
| 2007/0124930 A1* | 6/2007 | Cheng | H05K 1/0222 | 29/852 |
| 2007/0138646 A1* | 6/2007 | Heston | H01L 27/0802 | 257/774 |
| 2007/0166886 A1 | 7/2007 | Iihola et al. | | |
| 2007/0187237 A1 | 8/2007 | San et al. | | |
| 2008/0013250 A1* | 1/2008 | Aoki | H01G 4/012 | 361/306.3 |
| 2008/0047137 A1* | 2/2008 | Asahi | H01R 13/2414 | 29/876 |
| 2008/0060837 A1* | 3/2008 | Matsui | H05K 1/115 | 174/261 |
| 2008/0112109 A1* | 5/2008 | Muto | C04B 35/4682 | 361/301.4 |
| 2008/0158770 A1* | 7/2008 | Lee | H01G 4/005 | 361/301.1 |
| 2008/0158851 A1* | 7/2008 | Cochrane | H05K 9/0073 | 361/818 |
| 2008/0202799 A1* | 8/2008 | Graydon | H05K 1/184 | 174/256 |
| 2008/0223603 A1* | 9/2008 | Kim | H05K 1/162 | 174/255 |
| 2008/0236876 A1* | 10/2008 | Kodama | G02B 6/43 | 174/260 |
| 2008/0315024 A1* | 12/2008 | Gallagher | E06B 3/66323 | 242/159 |
| 2008/0318410 A1* | 12/2008 | Hwang | H01L 27/0688 | 438/625 |
| 2009/0046441 A1* | 2/2009 | Funaya | H01L 21/6835 | 361/783 |
| 2009/0097218 A1* | 4/2009 | Miyamoto | H05K 1/162 | 361/761 |
| 2009/0114421 A1* | 5/2009 | Swift | G01R 1/06755 | 174/128.1 |
| 2009/0133913 A1 | 5/2009 | Kushta et al. | | |
| 2009/0154872 A1* | 6/2009 | Sherrer | G02B 6/4248 | 385/14 |
| 2009/0175012 A1* | 7/2009 | Frasco | H05K 1/184 | 361/762 |
| 2009/0212412 A1 | 8/2009 | Yoon | | |
| 2009/0219667 A1* | 9/2009 | Eriksson | H01G 4/32 | 361/301.5 |
| 2009/0290318 A1 | 11/2009 | Takahashi | | |
| 2010/0026440 A1* | 2/2010 | Lim | H01F 17/0033 | 336/200 |

(56) References Cited

U.S. PATENT DOCUMENTS

| | | | | |
|---|---|---|---|---|
| 2010/0124035 | A1* | 5/2010 | Bandholz | H05K 1/162 361/782 |
| 2010/0208440 | A1* | 8/2010 | Peiffer | H05K 1/16 361/763 |
| 2010/0237495 | A1* | 9/2010 | Pagaila | H01L 21/568 257/700 |
| 2010/0326843 | A1* | 12/2010 | Zhang | A61B 5/14865 205/777.5 |
| 2011/0017502 | A1* | 1/2011 | Hardin | H05K 1/0222 174/260 |
| 2011/0017503 | A1* | 1/2011 | Hardin | H05K 1/184 174/260 |
| 2011/0017504 | A1* | 1/2011 | Hardin | H03H 7/0115 174/267 |
| 2011/0017505 | A1* | 1/2011 | Hardin | H05K 1/184 174/267 |
| 2011/0017507 | A1* | 1/2011 | Hardin | H05K 1/184 174/551 |
| 2011/0017581 | A1* | 1/2011 | Hardin | H01H 19/56 200/571 |
| 2011/0019374 | A1* | 1/2011 | Hardin | H05K 1/0248 361/761 |
| 2011/0019376 | A1* | 1/2011 | Hardin | H05K 1/184 361/763 |
| 2011/0037155 | A1* | 2/2011 | Pagaila | H01L 21/561 257/686 |
| 2013/0048199 | A1* | 2/2013 | Hall | H05K 3/4046 156/182 |
| 2013/0104394 | A1* | 5/2013 | Hardin | H01G 4/33 29/832 |
| 2013/0341078 | A1* | 12/2013 | Hardin | H05K 1/0222 174/267 |

FOREIGN PATENT DOCUMENTS

| | | |
|---|---|---|
| EP | 0982742 A1 | 3/2000 |
| JP | 2003324026 A | 11/2003 |
| JP | 2009246297 A | 10/2009 |
| JP | 2010-087266 A | 4/2010 |
| WO | 2010125924 A1 | 11/2010 |

OTHER PUBLICATIONS

Prosecution history of copending U.S. Appl. No. 13/222,418 including Non-Final Office Action dated Nov. 20, 2014.

Prosecution history of copending U.S. Appl. No. 13/528,129 including Non-Final Office Action dated Nov. 28, 2014.

U.S. Appl. No. 14/631,192, filed Feb. 25, 2015.

Notice of Allowance dated Feb. 27, 2015 for U.S. Appl. No. 13/222,418.

Partial Supplementary European Search Report dated Mar. 30, 2015 for European Patent Application No. 12827168.1.

Extended European Search Report dated Mar. 30, 2015 for European Patent Application No. 12827460.2.

Extended European Search Report dated Apr. 2, 2015 for European Patent Application No. 12827212.7.

Extended European Search Report dated Apr. 20, 2015 for European Patent Application No. 12844428.8.

Office Action dated Sep. 6, 2015 for China Patent Application No. 2012800418882.

English Translation of Office Action dated Sep. 6, 2015 for China Patent Application No. 2012800418882.

Examination Report dated Feb. 23, 2016 for China Patent Application No. 201280047549.5.

Non-Final Office Action dated Mar. 17, 2016 for U.S. Appl. No. 14/268,265 (Hall et al.).

Supplementary European Search Report and European Search Opinion dated Jul. 20, 2016 for European Patent Application No. 12836913.9.

* cited by examiner

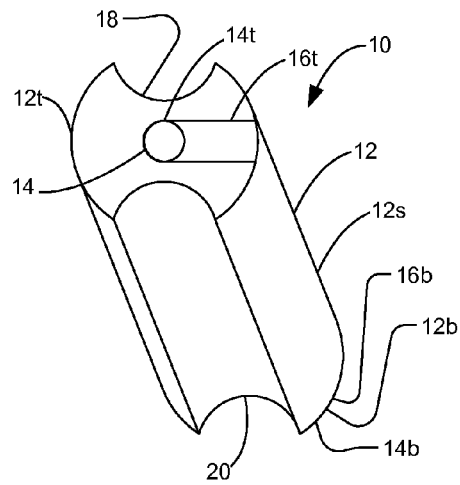
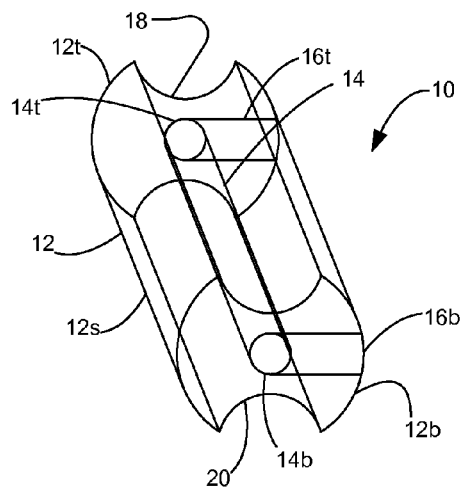
Figure 1
Figure 2
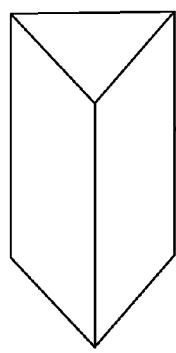
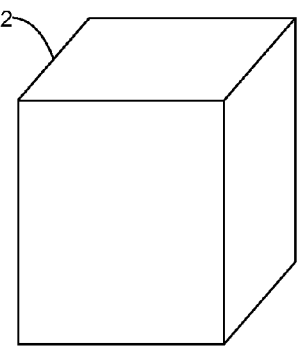
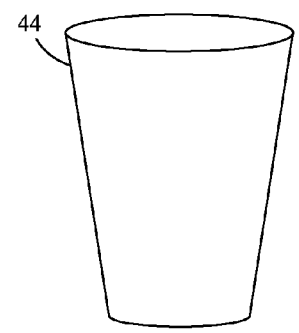
Figure 3A
Figure 3B
Figure 3C
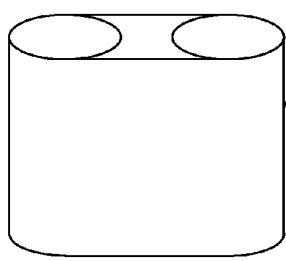
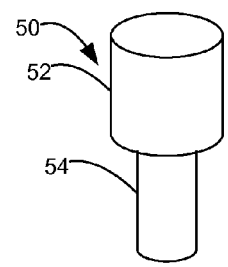
Figure 3D
Figure 3E
Figure 3F

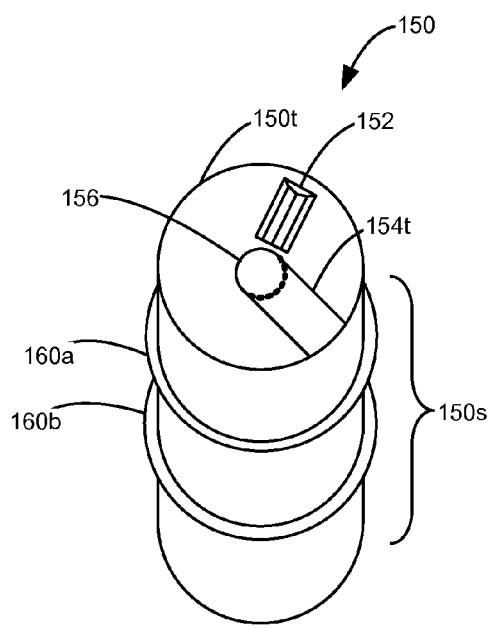
Figure 6A
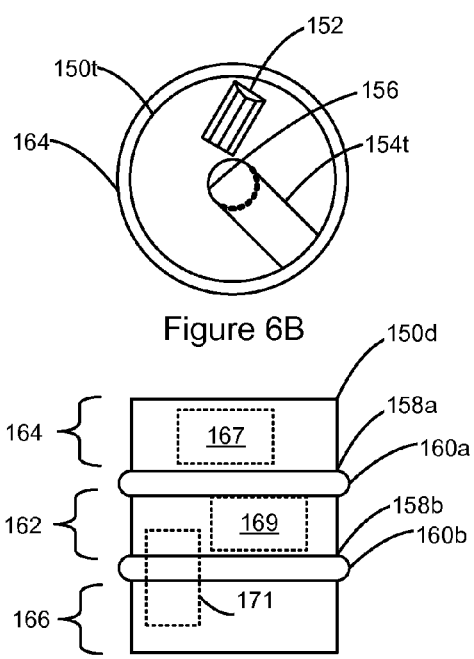
Figure 6B
Figure 6C
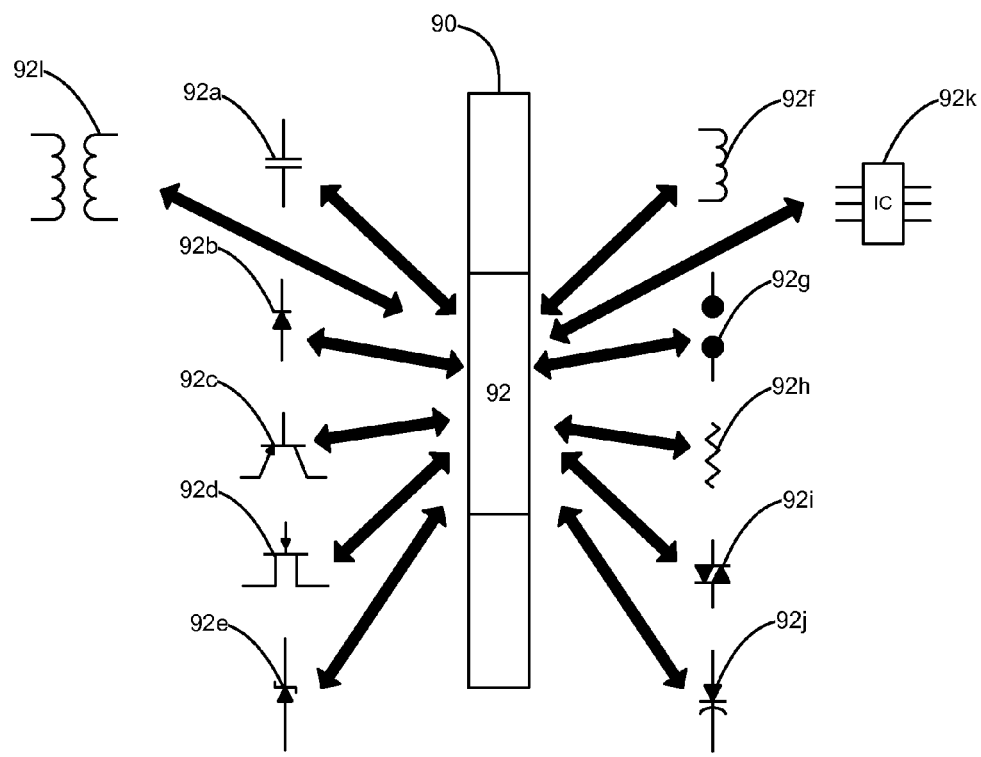
Figure 7

CONTINUOUS EXTRUSION METHOD FOR MANUFACTURING A Z-DIRECTED COMPONENT FOR INSERTION INTO A MOUNTING HOLE IN A PRINTED CIRCUIT BOARD

CROSS REFERENCES TO RELATED APPLICATIONS

This patent application is a divisional application of U.S. patent application Ser. No. 13/284,084, filed Oct. 28, 2011, now U.S. Pat. No. 8,943,684, entitled "Continuous Extrusion Process for Manufacturing a Z-Directed Component for a Printed Circuit Board." This patent application is related to U.S. patent application Ser. No. 13/222,748, filed Aug. 31, 2011, now U.S. Pat. No. 8,790,520, entitled "Die Press Process for Manufacturing a Z-Directed Component for a Printed Circuit Board," U.S. patent application Ser. No. 13/222,418, filed Aug. 31, 2011, now U.S. Pat. No. 9,078,374, entitled "Screening Process for Manufacturing a Z-Directed Component for a Printed Circuit Board," U.S. patent application Ser. No. 13/222,376, filed Aug. 31, 2011, now U.S. Pat. No. 8,920,316, entitled "Spin Coat Process for Manufacturing a Z-Directed Component for a Printed Circuit Board," and U.S. patent application Ser. No. 13/250,812, filed Sep. 30, 2011, now U.S. Pat. No. 8,752,280, entitled "Extrusion Process for Manufacturing a Z-Directed Component for a Printed Circuit Board," which are assigned to the assignee of the present application.

BACKGROUND

1. Field of the Disclosure

The present invention relates generally to processes for manufacturing printed circuit board components and more particularly to a continuous extrusion process for manufacturing a Z-directed component for a printed circuit board.

2. Description of the Related Art

The following co-pending United States patent applications, which are assigned to the assignee of the present application, describe various "Z-directed" components that are intended to be embedded or inserted into a printed circuit board ("PCB"): Ser. No. 12/508,131 entitled "Z-Directed Components for Printed Circuit Boards," Ser. No. 12/508,145 entitled "Z-Directed Pass-Through Components for Printed Circuit Boards," Ser. No. 12/508,158 entitled "Z-Directed Capacitor Components for Printed Circuit Boards," Ser. No. 12/508,188 entitled "Z-Directed Delay Line Components for Printed Circuit Boards," Ser. No. 12/508,199 entitled "Z-Directed Filter Components for Printed Circuit Boards," Ser. No. 12/508,204 entitled "Z-Directed Ferrite Bead Components for Printed Circuit Boards," Ser. No. 12/508,215 entitled "Z-Directed Switch Components for Printed Circuit Boards," Ser. No. 12/508,236 entitled "Z-Directed Connector Components for Printed Circuit Boards," and Ser. No. 12/508,248 entitled "Z-Directed Variable Value Components for Printed Circuit Boards."

As densities of components for printed circuit boards have increased and higher frequencies of operation are used, some circuits' designs have become very difficult to achieve. The Z-directed components described in the foregoing patent applications are designed to improve the component densities and frequencies of operation. The Z-directed components occupy less space on the surface of a PCB and for high frequency circuits, e.g. clock rates greater than 1 GHz, allow for higher frequency of operation. The foregoing patent applications describe various types of Z-directed components including, but not limited to, capacitors, delay lines, transistors, switches, and connectors. A process that permits mass production of these components on a commercial scale is desired.

SUMMARY

A method for manufacturing a Z-directed component for insertion into a mounting hole in a printed circuit board according to one example embodiment includes simultaneously extruding a plurality of materials according to the structure of the Z-directed component to form an extruded object and forming the Z-directed component from the extruded object.

A method for manufacturing a plurality of Z-directed components each for insertion into a respective mounting hole in a printed circuit board according to another example embodiment includes continuously extruding a plurality of materials in a lengthwise direction according to the structure of the Z-directed component to form an extruded object. The extruded object is divided into individual Z-directed components and each Z-directed component is cured.

A method for manufacturing a Z-directed component for insertion into a mounting hole in a printed circuit board according to another example embodiment includes simultaneously extruding a plurality of materials according to the structure of the Z-directed component to form an extruded object. The timing of extrusion between predetermined sections of one of the materials is varied in order to stagger the sections in the extruded object. The Z-directed component is formed from the extruded object.

BRIEF DESCRIPTION OF THE DRAWINGS

The above-mentioned and other features and advantages of the various embodiments, and the manner of attaining them, will become more apparent and will be better understood by reference to the accompanying drawings.

FIG. 1 is a perspective view of a Z-directed component according to one example embodiment.

FIG. 2 is a transparent perspective view of the Z-directed component shown in FIG. 1 illustrating the internal arrangement of elements of the Z-directed component.

FIGS. 3A-3F are perspective views showing various example shapes for the body of a Z-directed component.

FIG. 6A is a perspective view of a Z-directed component having O-rings for connecting to internal layers of a PCB and having a body having regions comprised of similar and/or dissimilar materials according to one example embodiment.

FIG. 6B is a top plan view of the Z-directed component shown in FIG. 6A.

FIG. 6C is a schematic side elevation view of the Z-directed component shown in FIG. 6A.

FIG. 7 is a schematic illustration of various example elements or electronic components that may be provided within the body of a Z-directed component in series with a conductive channel.

DETAILED DESCRIPTION

Figures 4A, 4B, 4C:
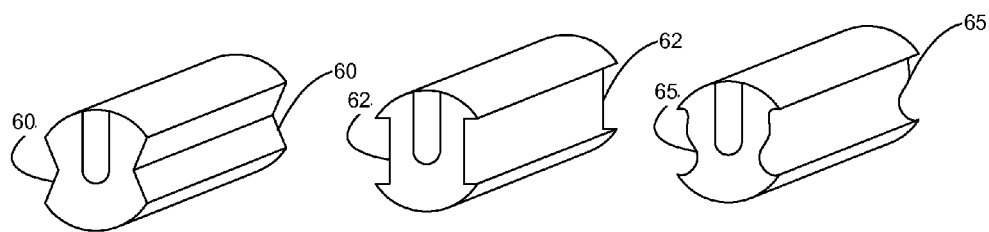
FIGS. 4A-4C are perspective views showing various example side channel configurations for a Z-directed component.

The following description and drawings illustrate embodiments sufficiently to enable those skilled in the art to practice the present invention. It is to be understood that the disclosure is not limited to the details of construction and the arrangement of components set forth in the following description or illustrated in the drawings. The invention is capable of other embodiments and of being practiced or of being carried out in various ways. For example, other embodiments may incorporate structural, chronological, electrical, process, and other changes. Examples merely typify possible variations. Individual components and functions are optional unless explicitly required, and the sequence of operations may vary. Portions and features of some embodiments may be included in or substituted for those of others. The scope of the application encompasses the appended claims and all available equivalents. The following description is, therefore, not to be taken in a limited sense and the scope of the present invention is defined by the appended claims.

Also, it is to be understood that the phraseology and terminology used herein is for the purpose of description and should not be regarded as limiting. The use of "including," "comprising," or "having" and variations thereof herein is meant to encompass the items listed thereafter and equivalents thereof as well as additional items. Unless limited otherwise, the terms "connected," "coupled," and "mounted," and variations thereof herein are used broadly and encompass direct and indirect connections, couplings, and mountings. In addition, the terms "connected" and "coupled" and variations thereof are not restricted to physical or mechanical connections or couplings.

Overview of Z-Directed Components

An X-Y-Z frame of reference is used herein. The X and Y axes describe the plane defined by the face of a printed circuit board. The Z-axis describes a direction perpendicular to the plane of the circuit board. The top surface of the PCB has a zero Z-value. A component with a negative Z-direction value indicates that the component is inserted into the top surface of the PCB. Such a component may be above (extend past), flush with, or recessed below either the top surface and/or the bottom surface of the PCB. A component having both a positive and negative Z-direction value indicates that the component is partially inserted into the surface of the PCB. The Z-directed components are intended to be inserted into a hole or recess in a printed circuit board. Depending on the shape and length of the component(s), more than one Z-directed component may be inserted into a single mounting hole in the PCB, such as being stacked together or positioned side by side. The hole may be a through hole (a hole from the top surface through to the bottom surface), a blind hole (an opening or recess through either the top or bottom surface into an interior portion or internal layer of the PCB) or an internal cavity such that the Z-directed component is embedded within the PCB.

For a PCB having conductive traces on both external layers, one external layer is termed the top surface and the other the bottom surface. Where only one external layer has conductive traces, that external surface is referred to as the top surface. The Z-directed component is referred to as having a top surface, a bottom surface and a side surface. The references to top and bottom surfaces of the Z-directed component conform to the convention used to refer to the top and bottom surfaces of the PCB. The side surface of a Z-directed component extends between the top and bottom surfaces of the PCB and would be adjacent to the wall of the mounting hole in the PCB where the mounting hole is perpendicular to the face of the PCB. This use of top, bottom and side should not be taken as limiting how a Z-directed component may be mounted into a PCB. Although the components are described herein as being mounted in a Z-direction, this does not mean that such components are limited to being inserted into a PCB only along the Z-axis. Z-directed components may be mounted normal to the plane of the PCB from the top or bottom surfaces or both surfaces, mounted at an angle thereto or, depending on the thickness of the PCB and the dimensions of the Z-directed component, inserted into the edge of the PCB between the top and bottom surfaces of the PCB. Further, the Z-directed components may be inserted into the edge of the PCB even if the Z-directed component is wider than the PCB is tall as long as the Z-directed component is held in place.

The Z-directed components may be made from various combinations of materials commonly used in electronic components. The signal connection paths are made from conductors, which are materials that have high conductivity. Unless otherwise stated, reference to conductivity herein refers to electrical conductivity. Conducting materials include, but are not limited to, copper, gold, aluminum, silver, tin, lead and many others. The Z-directed components may have areas that need to be insulated from other areas by using insulator materials that have low conductivity like plastic, glass, FR4 (epoxy & fiberglass), air, mica, ceramic and others. Capacitors are typically made of two conducting plates separated by an insulator material that has a high permittivity (dielectric constant). Permittivity is a parameter that shows the ability to store electric fields in the materials like ceramic, mica, tantalum and others. A Z-directed component that is constructed as a resistor requires materials that have properties that are between a conductor and insulator having a finite amount of resistivity, which is the reciprocal of conductivity. Materials like carbon, doped semiconductor, nichrome, tin-oxide and others are used for their resistive properties. Inductors are typically made of coils of wires or conductors wrapped around a material with high permeability. Permeability is a parameter that shows the ability to store magnetic fields in the material which may include iron and alloys like nickel-zinc, manganese-zinc, nickel-iron and others. Transistors such as field effect transistors ("FETs") are electronic devices that are made from semiconductors that behave in a nonlinear fashion and are made from silicon, germanium, gallium arsenide and others.

Throughout the application there are references that discuss different materials, properties of materials or terminology interchangeably as currently used in the art of material science and electrical component design. Because of the flexibility in how a Z-directed component may be employed and the number of materials that may be used, it is also contemplated that Z-directed components may be constructed of materials that have not been discovered or created to date. The body of a Z-directed component will in general be comprised of an insulator material unless otherwise called out in the description for a particular design of a Z-directed component. This material may possess a desired permittivity, e.g., the body of a capacitor will typically be comprised of an insulator material having a relatively high dielectric constant.

PCBs using a Z-directed component may be constructed to have a single conductive layer or multiple conductive layers as is known. The PCB may have conductive traces on the top surface only, on the bottom surface only, or on both the top and bottom surfaces. In addition, one or more intermediate internal conductive trace layers may also be present in the PCB.

Connections between a Z-directed component and the traces in or on a PCB may be accomplished by soldering techniques, screening techniques, extruding techniques or plating techniques known in the art. Depending on the application, solder pastes and conductive adhesives may be used. In some configurations, compressive conductive members may be used to interconnect a Z-directed component to conductive traces found on the PCB.

The most general form of a Z-directed component comprises a body having a top surface, a bottom surface and a side surface, a cross-sectional shape that is insertable into a mounting hole of a given depth D within a PCB with a portion of the body comprising an insulator material. All of the embodiments described herein for Z-directed components are based on this general form.

FIGS. 1 and 2 show an embodiment of a Z-directed component. In this embodiment, Z-directed component 10 includes a generally cylindrical body 12 having a top surface 12*t*, a bottom surface 12*b*, a side surface 12*s*, and a length L generally corresponding to the depth D of the mounting hole. The length L can be less than, equal to or greater than the depth D. In the former two cases, Z-directed component 10 would in one case be below at least one of the top and bottom surfaces of the PCB and in the other it may be flush with the two surfaces of the PCB. Where length L is greater than depth D, Z-directed component 10 would not be flush mounted with at least one of the top and bottom surfaces of the PCB. However, with this non-flush mount, Z-directed component 10 would be capable of being used to interconnect to another component or another PCB that is positioned nearby. The mounting hole is typically a through-hole extending between the top and bottom surfaces of the PCB but it may also be a blind hole. When recessed below the surface of the PCB, additional resist areas may be required in the hole of the PCB to keep from plating the entire circumferential area around the hole.

Z-directed component 10 in one form may have at least one conductive channel 14 extending through the length of body 12. At the top and bottom ends 14*t* and 14*b* of conductive channel 14, top and bottom conductive traces 16*t*, 16*b* are provided on the top and bottom end surfaces 12*t*, 12*b* of body 12 and extend from respective ends of the conductive channel 14 to the edge of Z-directed component 10. In this embodiment, body 12 comprises an insulator material. Depending on its function, body 12 of Z-directed component 10 may be made of variety of materials having different properties. These properties include being conductive, resistive, magnetic, dielectric, or semi-conductive or various combinations of properties as described herein. Examples of materials that have the properties are copper, carbon, iron, ceramic or silicon, respectively. Body 12 of Z-directed component 10 may also comprise a number of different networks needed to operate a circuit that will be discussed later.

One or more longitudinally extending channels or wells may be provided on the side surface of body 12 of Z-directed component 10. The channel may extend from one of the top surface and the bottom surface of body 12 toward the opposite surface. As illustrated, two concave side wells or channels 18 and 20 are provided in the outer surface of Z-directed component 10 extending the length of body 12. When plated or soldered, these channels allow electrical connections to be made to Z-directed component 10, through the PCB, as well as to internal conductive layers within the PCB. The length of side channels 18 or 20 may extend less than the entire length of body 12.

FIG. 2 shows the same component as in FIG. 1 but with all the surfaces transparent. Conductive channel 14 is shown as a cylinder extending through the center of Z-directed component 10. Other shapes may also be used for conductive channel 14. Traces 16*t* and 16*b* can be seen extending from ends 14*t* and 14*b* of conductive channel 14, respectively, to the edge of body 12. While traces 16*t* and 16*b* are shown as being in alignment with one another (zero degrees apart), this is not a requirement and they may be positioned as needed for a particular design. For example, traces 16*t* and 16*b* may be 180 degrees apart or 90 degrees apart or any other increment.

The shape of the body of the Z-directed component may be any shape that can fit into a mounting hole in a PCB. FIGS. 3A-3F illustrate possible body shapes for a Z-directed component. FIG. 3A shows a triangular cross-sectional body 40; FIG. 3B shows a rectangular cross-sectional body 42; FIG. 3C shows a frusto-conical body 44; FIG. 3D shows an ovate cross-sectional cylindrical body 46; and FIG. 3E shows a cylindrical body 48. FIG. 3F shows a stepped cylindrical body 50 where one portion 52 has a larger diameter than another portion 54. With this arrangement, the Z-directed component may be mounted on the surface of the PCB while having a section inserted into a mounting hole provided in the PCB. The edges of the Z-directed component may be beveled to help with aligning the Z-directed component for insertion into a mounting hole in a PCB. Other shapes and combinations of those illustrated may also be used for a Z-directed component as desired.

For a Z-directed component, the channels for plating can be of various cross-sectional shapes and lengths. The only requirement is that plating or solder material make the proper connections to the Z-directed component and corresponding conductive traces in or on the PCB. Side channels 18 or 20 may have, for example, V-, C- or U-shaped cross-sections, semi-circular or elliptical cross-sections. Where more than one channel is provided, each channel may have the same or a different cross-sectional shape. FIGS. 4A-4C illustrate three side channel shapes. In FIG. 4A, V-shaped side channels 60 are shown. In FIG. 4B, U- or C-shaped side channels 62 are shown. In FIG. 4C, wavy or irregular cross-sectional side channel shapes 65 are shown.

The numbers of layers in a PCB varies from being single sided to being over 22 layers and may have different overall thicknesses that range from less than 0.051 inch to over 0.093 inch or more. Where a flush mount is desired, the length of the Z-directed component will depend on the thickness of the PCB into which it is intended to be inserted. The Z-directed component's length may also vary depending on the intended function and tolerance of a process. The preferred lengths will be where the Z-directed component is either flush with the surfaces or extends slightly beyond the surface of the PCB. This would keep the plating solution from plating completely around the interior of the PCB hole that may cause a short in some cases. It is possible to add a resist material around the interior of a PCB hole to only allow plating in the desired areas. However, there are some cases where it is desired to completely plate around the interior of a PCB hole above and below the Z-directed component. For example, if the top layer of the PCB is a $V_{CC}$ plane and the bottom layer is a GND plane then a decoupling capacitor would have lower impedance if the connection used a greater volume of copper to make the connection.

There are a number of features that can be added to a Z-directed component to create different mechanical and electrical characteristics. The number of channels or conductors can be varied from zero to any number that can maintain enough strength to take the stresses of insertion, plating, manufacturing processes and operation of the PCB in its intended environment. The outer surface of a Z-directed component may have a coating that glues it in place. Flanges or radial projections may also be used to prevent over or under insertion of a Z-directed component into the mounting hole, particularly where the mounting hole is a through-hole. A surface coating material may also be used to promote or impede migration of the plating or solder material. Various locating or orienting features may be provided such as a recess or projection, or a visual or magnetic indicator on an end surface of the Z-directed component. Further, a connecting feature such as a conductive pad, a spring loaded style pogo-pin or even a simple spring may be included to add an additional electrical connection (such as frame ground) point to a PCB.

Figures 5A, 5B, 5C, 5D:
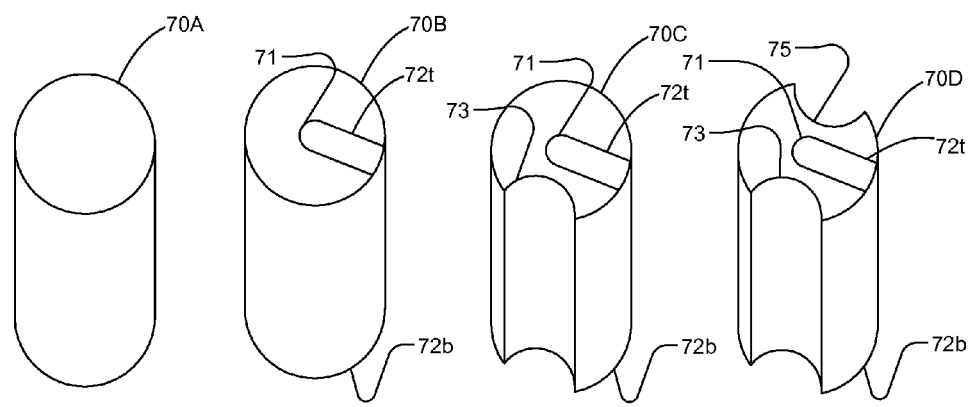
FIGS. 5A-5H are perspective views showing various example channel configurations for the body of a Z-directed component.
Figures 5E, 5F, 5G, 5H:
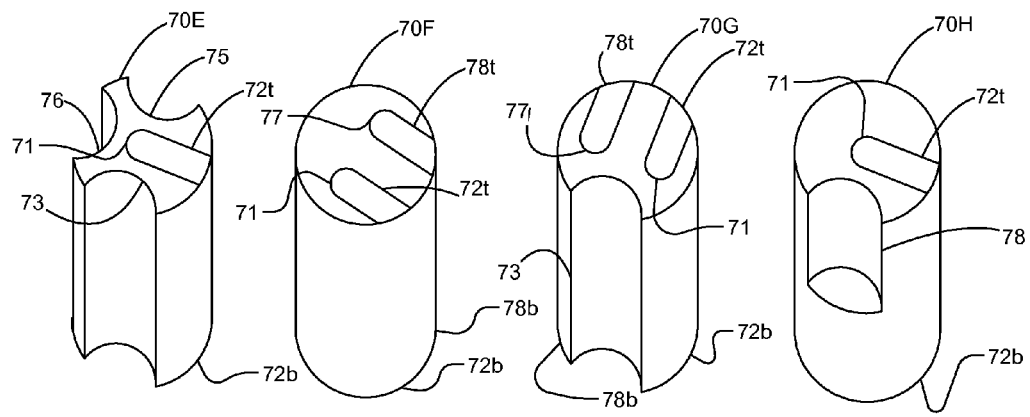

A Z-directed component may take on several roles depending on the number of ports or terminals needed to make connections to the PCB. Some possibilities are shown in FIGS. 5A-H. FIG. 5A is a Z-directed component configured as 0-port device 70A used as a plug so that if a filter or a component is optional then the plug stops the hole from being plated. After the PCB has been manufactured, the 0-port device 70A may be removed and another Z-directed component may be inserted, plated and connected to the circuit. FIGS. 5B-5H illustrate various configurations useful for multi-terminal devices such as resistors, diodes, transistors, and/or clock circuits. FIG. 5B shows a 1-port or single signal Z-directed component 70B having a conductive channel 71 through a center portion of the component connected to top and bottom conductive traces 72*t*, 72*b*. FIG. 5C shows a 1-port 1-channel Z-directed component 70C where one plated side well or channel 73 is provided in addition to conductive channel 71 through the component, which is connected to top and bottom conductive traces 72*t* and 72*b*. FIG. 5D shows a Z-directed component 70D having two side wells 73 and 75 in addition to conductive channel 71 through the component which is connected to top and bottom traces 72*t*, 72*b*. The Z-directed component 70E of FIG. 5E has three side wells 73, 75 and 76 in addition to conductive channel 71 through the component, which is connected to top and bottom traces 72*t*, 72*b*. FIG. 5F shows Z-directed component 70F having two conductive channels 71 and 77 through the component each with their respective top and bottom traces 72*t*, 72*b* and 78*t*, 78*b* and no side channels or wells. Z-directed component 70F is a two signal device to be primarily used for differential signaling. FIG. 5G shows a Z-directed component 70G having one side well 73 and two conductive channels 71 and 77 each with their respective top and bottom traces 72*t*, 72*b* and 78*t*, 78*b*. FIG. 5H shows Z-directed component 70H having one conductive channel 71 with top and bottom traces 72*t*, 72*b* and a blind well or partial well 78 extending from the top surface along a portion of the side surface that will allow the plating material or solder to stop at a given depth. For one skilled in the art, the number of wells and signals is only limited by the space, required well or channel sizes.

FIGS. 6A-C illustrate another configuration for a Z-directed component utilizing O-rings for use in a PCB having a top and bottom conductive layer and at least one internal conductive layer. Z-directed component 150 is shown having on its top surface 150*t*, a locating feature 152 and a conductive top trace 154*t* extending between a conductive channel 156 and the edge of body 150*d* on its top surface 150*t*. A conductive bottom trace (not shown) is provided on the bottom surface. Conductive channel 156 extends through a portion of the body 150*d* as previously described. Located on the side surface 150*s* of body 150*d* is a least one semi-circular channel or grove. As shown, a pair of axially spaced apart circumferential channels 158*a*, 158*b* is provided having O-rings 160*a*, 160*b*, respectively disposed within channels 158*a*, 158*b*. A portion of the O-rings 160*a*, 160*b* extend out beyond the side surface 150*s* of the body 150*d*. O-rings 160*a*, 160*b* would be positioned adjacent one or more of the internal layers of the PCB to make electrical contract to one or more traces provided at that point in the mounting hole for the Z-directed component. Depending on the design employed, an O-ring would not have to be provided adjacent every internal layer.

O-rings 160*a*, 160*b* may be conductive or non-conductive depending on the design of the circuit in which they are used. O-rings 160*a*, 160*b* preferably would be compressive helping to secure Z-directed component 150 within the mounting hole. The region 162 of body 150*d* intermediate O-rings 160*a*, 160*b* may be comprised of different material than the regions 164 and 166 of the body 150*d* outside of the O-rings. For example, if the material of region 162 is of a resistive material and O-rings 160*a*, 160*b* are conductive then internal circuit board traces in contact with the O-rings 160*a*, 160*b* see a resistive load.

Regions 164 and 166 may also be comprised of a material having different properties from each other and region 162. For example, region 164 may be resistive, region 162 capacitive and region 166 inductive. Each of these regions can be electrically connected to the adjoining layers of the PCB. Further, conductive channel 156 and traces 154*t*, 154*b* do not need to be provided. So for the illustrated construction, between the top layer of the PCB and the first internal layer from the top, a resistive element may be present in region 164, a capacitive element between the first internal layer and the second internal layer in region 162 and an inductive element between the second internal layer and the bottom layer of the PCB in region 166. Accordingly, for a signal transmitted from an internal trace contacting conductive O-ring 160*a* to a second internal trace contacting conductive O-ring 160*b*, the signal would see an inductive load. The material for regions 162, 164, 166 may have properties selected from a group comprising conductive, resistive, magnetic, dielectric, capacitive or semi-conductive and combinations thereof. The design may be extended to circuit boards having fewer or more internal layers than that described without departing from the spirit of the invention.

In addition, regions 162, 164, 166 may have electronic components 167, 169, 171 embedded therein and connected as described herein. Also, as illustrated for component 171, a component may be found within one or more regions within the body of a Z-directed component. Internal connections may be provided from embedded components to O-rings 160*a*, 160*b*. Alternatively, internal connections may be provided from the embedded components to plateable pads provided on the side surface 150*s*.

The various embodiments and features discussed for a Z-directed component are meant to be illustrative and not limiting. A Z-directed component may be made of a bulk material that performs a network function or may have other parts embedded into its body. A Z-directed component may be a multi-terminal device and, therefore, may be used to perform a variety of functions including, but not limited to: transmission lines, delay lines, T filters, decoupling capacitors, inductors, common mode chokes, resistors, differential pair pass throughs, differential ferrite beads, diodes, or ESD protection devices (varistors). Combinations of these functions may be provided within one component.

FIG. 7 illustrates various example configurations for a conductive channel in a Z-directed component. As shown, channel 90 has a region 92 intermediate the ends comprising a material having properties selected from a group comprising conductive, resistive, magnetic, dielectric, capacitive or semi-conductive properties and combinations thereof. These materials form a variety of components. Additionally, a component may be inserted or embedded into region 92 with portions of the conductive channel extending from the terminals of the component. A capacitor 92*a* may be provided in region 92. Similarly, a diode 92*b*, a transistor 92*c* such as a MOSFET 92*d*, a zener diode 92*e*, an inductor 92*f*, a surge suppressor 92*g*, a resistor 92*h*, a diac 92*i*, a varactor 92*j* and combinations of these items are further examples of materials that may be provided in region 92 of conductive channel 90. While region 92 is shown as being centered within the conductive channel 90, it is not limited to that location.

For a multi-terminal device such as transistor 92*c*, MOSFET 92*d*, an integrated circuit 92*k*, or a transformer 92*l*, one portion of the conductive channel may be between the top surface trace and a first terminal of the device and the other portion of the conductive channel between the bottom surface trace and a second terminal of the device. For additional device terminals, additional conductors may be provided in the body of the Z-directed component to allow electrical connection to the remaining terminals or additional conductive traces may be provided within the body of the Z-directed component between the additional terminals and channels on the side surface of the body of a Z-directed component allowing electrical connection to an external conductive trace. Various connection configurations to a multiple terminal device may be used in a Z-directed component.

Accordingly, those skilled in the art will appreciate that various types of Z-directed components may be utilized including, but not limited to, capacitors, delay lines, transistors, switches, and connectors. For example, FIGS. 8 and 9 illustrate a Z-directed component termed a signal pass-through that is used for passing a signal trace from the top surface of a PCB to the bottom surface.

Z-Directed Signal Pass-Through Component

Figure 8:
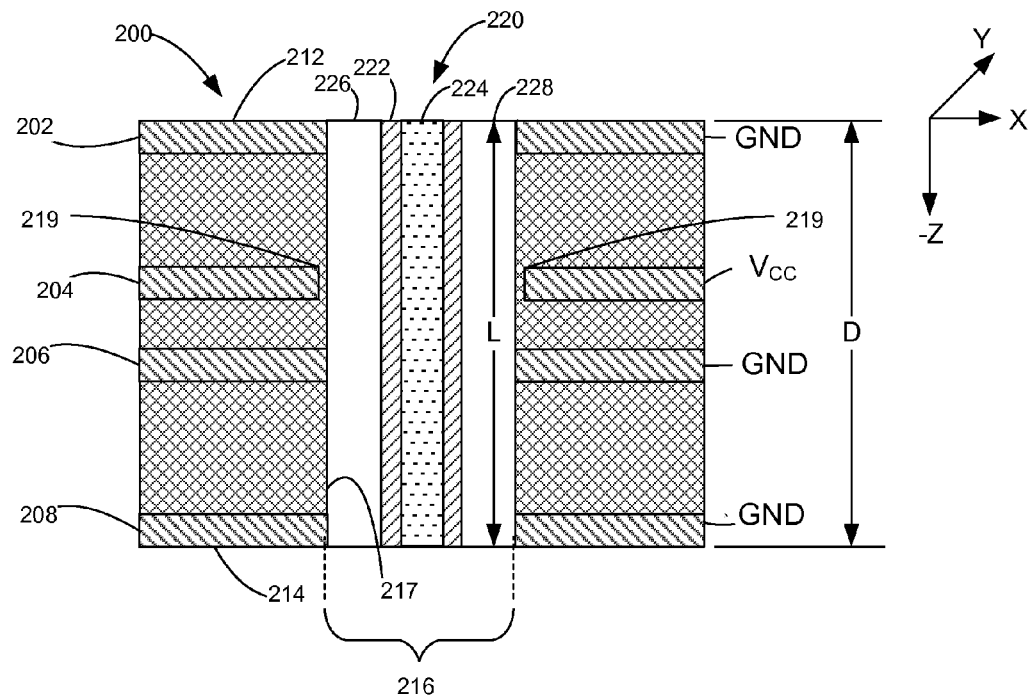
FIG. 8 is a schematic cross-sectional view of a Z-directed component flush mounted in a PCB showing conductive traces and connections to the Z-directed component according to one example embodiment.
Figure 9:
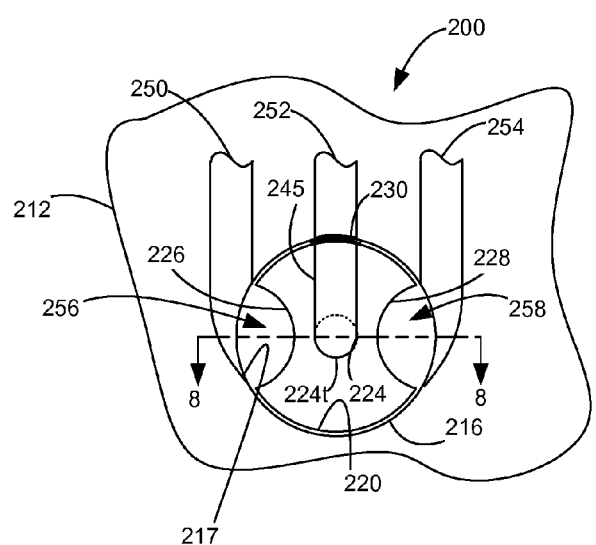
FIG. 9 is a top plan view of the Z-directed component and PCB shown in FIG. 8.

FIG. 8 shows a sectional view taken along line 8-8 in FIG. 9 of a PCB 200 having 4 conductive planes or layers comprising, from top to bottom, a ground (GND) plane or trace 202, a voltage supply plane $V_{CC}$ 204, a second ground GND plane 206 and a third ground GND plane or trace 208 separated by nonconductive material such as a phenolic plastic such as FR4 which is widely used as is known in the art. PCB 200 may be used for high frequency signals. The top and bottom ground planes or traces 202 and 208, respectively, on the top and bottom surfaces 212 and 214, respectively, of PCB 200 are connected to conductive traces leading up to Z-directed component 220. A mounting hole 216 having a depth D in a negative Z direction is provided in PCB 200 for the flush mounting of Z-directed component 220. Here depth D corresponds to the thickness of PCB 200; however, depth D may be less than the thickness of PCB 200 creating a blind hole therein. Mounting hole 216, as illustrated, is a through-hole that is round in cross-section to accommodate Z-directed component 220 but may have cross sections to accommodate the insertion of Z-directed components having other body configurations. In other words, mounting holes are sized so that Z-directed components are insertable therein. For example, a Z-directed component having a cylindrical shape may be inserted into a square mounting hole and vice versa. In the cases where Z-directed component does not make a tight fit, resist materials will have to be added to the areas of the component and PCB where copper plating is not desired.

Z-directed component 220 is illustrated as a three lead component that is flush mounted with respect to both the top surface 212 and bottom surface 214 of PCB 200. Z-directed component 220 is illustrated as having a generally cylindrical body 222 of a length L. A center conductive channel or lead 224, illustrated as being cylindrical, is shown extending the length of body 222. Two concave side wells or channels 226 and 228, which define the other two leads, are provided on the side surface of Z-directed component 220 extending the length of body 222. Side channels 226 and 228 are plated for making electrical connections to Z-directed component 220 from various layers of PCB 200. As shown, the ground plane traces on layers 202, 206, and 208 of PCB 100 are electrically connected to side channels 226 and 228. $V_{CC}$ plane 204 does not connect to Z-directed component 220 as shown by the gap 219 between $V_{CC}$ plane 204 and wall 217 of mounting hole 216.

FIG. 9 illustrates a top view of Z-directed component 220 in PCB 200. Three conductive traces 250, 252 and 254 lead up to the edge of wall 217 of mounting hole 216. As illustrated, trace 252 serves as a high-frequency signal trace to be passed from the top surface 212 to the bottom surface 214 of PCB 200 via Z-directed component 220. Conductive traces 250 and 254 serve as ground nets. Center lead or conductive channel 224 is electrically connected to trace 252 on the top surface 212 of PCB 200 by a top trace 245 and plating bridge 230. Top trace 245 on the top surface of Z-directed component 220 extends from the top end 224t of conductive channel 224 to the edge of Z-directed component 220. Although not shown, the bottom side of Z-directed component 220 and bottom surface 214 of PCB 200 is configured in a similar arrangement of traces as shown on top surface 212 of PCB 200 illustrated in FIG. 12. A bottom trace on the bottom surface of Z-directed component 220 extends from bottom of conductive channel 224 to the edge of Z-directed component 220. A plating bridge is used to make the electrical connection between the bottom trace and another high frequency signal trace provided on the bottom surface of PCB 200. The transmission line impedance of the Z-directed component can be adjusted to match the PCB trace impedance by controlling the conductor sizes and distances between each conductor which improves the high speed performance of the PCB.

During the plating process, wells 256 and 258 formed between wall 217 of mounting hole 216 and side channels 226 and 228 allow plating material or solder pass from the top surface 212 to the bottom surface 214 electrically interconnecting traces 250 and 254, respectively to side channels 226 and 228, respectively, of Z-directed component 220 and also to similarly situated traces provided on the bottom surface 214 of PCB 200 interconnecting ground planes or traces 202, 206 and 208. The plating is not shown for purposes of illustrating the structure. In this embodiment, $V_{CC}$ plane 204 does not connect to Z-directed component 220.

One of the challenges for high frequency signal speeds is the reflections and discontinuities due to signal trace transmission line impedance changes. Many PCB layouts try to keep high frequency signals on one layer because of these discontinuities caused by the routing of signal traces through the PCB. Standard vias through a PCB have to be spaced some distance apart which creates high impedance between the signal via and the return signal via or ground via. As illustrated in FIGS. 8 and 9, the Z-directed component and the return ground or signals have a very close and controlled proximity that allow essentially constant impedance from the top surface 212 to the bottom surface 214 of PCB 200.

Figure 10:
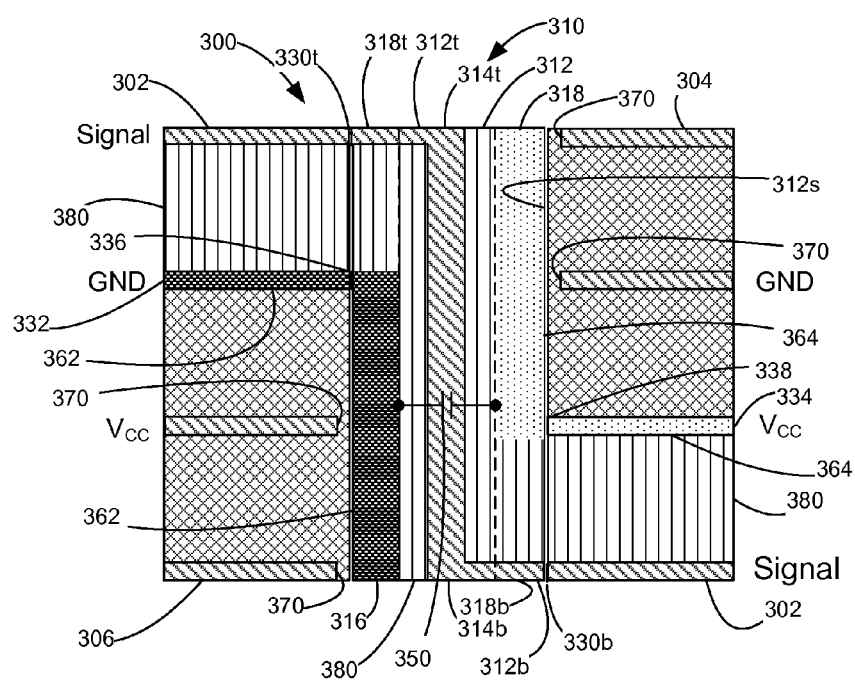
FIG. 10 is a schematic cross-sectional view of a Z-directed component flush mounted in a PCB showing ground loops for the Z-directed component with the Z-directed component further having a decoupling capacitor within its body according to one example embodiment.

A Z-directed signal pass through component may also comprise a decoupling capacitor that will allow the reference plane of a signal to switch from a ground plane, designated GND, to a voltage supply plane, designated $V_{CC}$, without having a high frequency discontinuity. FIG. 10 shows a cross-sectional view of a typical 4-layer PCB 300 with a signal trace 302 transferring between the top layer 304 and the bottom layer 306. Z-directed component 310, similar to that shown in FIG. 5D, having body 312 connects signal trace 302 through center conductive channel 314. Z-directed component 310 also comprises plated side channels 316 and 318 extending along the side surface 312s of the body 312. The top 314t and bottom 314b of conductive channel 314 are connected to conductive traces 318t and 318b on the top 312t and bottom 312b of body 312. These, in turn, are connected to signal trace 302 via top and bottom plating bridges 330t and 330b. Side channels 316 and 318 are plated to GND plane 332 and $V_{CC}$ plane 334, respectively. Connection points 336 and 338, respectively, illustrate this electrical connection. Schematically illustrated decoupling capacitor 350 is internal to body 312 and is connected between side channels 316 and 318. Decoupling capacitor 350 may be a separate capacitor integrated into the body 312 of Z-directed component 310 or it can be formed by fabricating a portion of the body 312 of Z-directed component 310 from the required materials with dielectric properties between conductive surfaces.

The path for signal trace 302 is illustrated with diagonal hatching and can be seen to run from top layer 304 to bottom layer 306. GND plane 332 and side channel 316 are electrically connected at 336 with the signal path return indicated by the dark stippling 362. $V_{CC}$ plane 334 and side channel 318 are electrically connected at 338 with the signal path return indicated by the light stippling 364. As is known in the art, where a signal plane or trace is not to be connected to the inserted part, those portions are spaced apart from the component as shown at 370. Where a signal plane or trace is to be connected to an inserted component, the signal plane or trace is provided at the wall or edge of the opening to allow the plating material or solder to bridge therebetween as illustrated at points 330t, 330b, 336, and 338.

The vertically hatched portion 380 shows the high speed loop area between the signal trace and return current path described by the signal trace 302 and the GND plane 332 or $V_{CC}$ plane 334. The signal trace 302 on the bottom surface 306 is referenced to power plane $V_{CC}$ 334 that is coupled to the GND plane 332 through decoupling capacitor 350. This coupling between the two planes will keep the high frequency impedance close to constant for the transition from one return plane to another plane of a different DC voltage.

Figure 11:
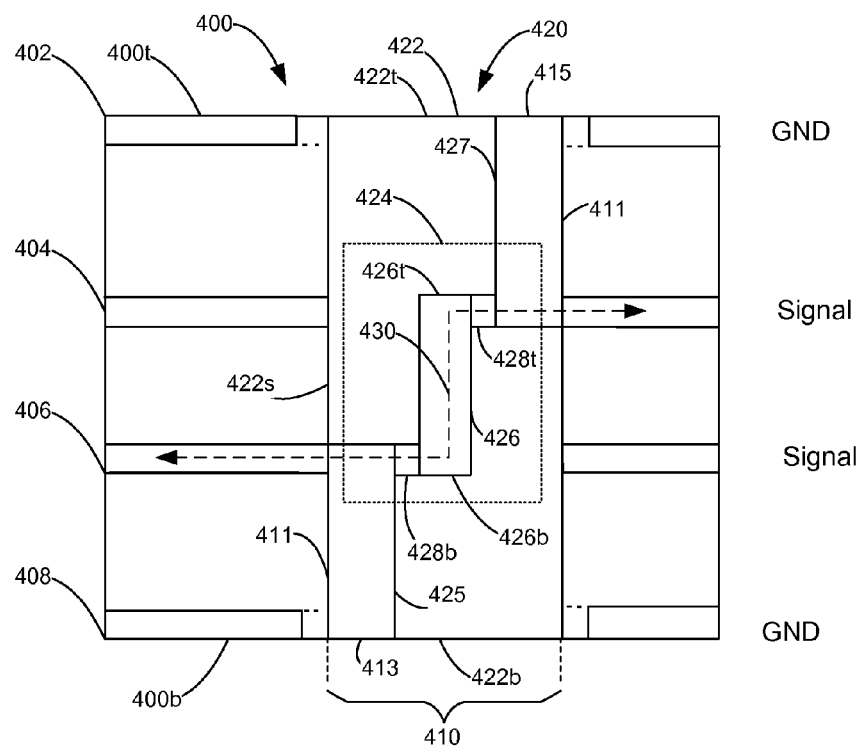
FIG. 11 is a schematic cross-sectional view of a Z-directed component flush mounted in a PCB showing a Z-directed component for transferring a signal trace from one internal layer of a PCB to another internal layer of that PCB according to one example embodiment.

Internally mounting Z-directed components in a PCB greatly facilitates the PCB technique of using outer ground planes for EMI reduction. With this technique, signals are routed on the inner layers as much as possible. FIG. 11 illustrates one embodiment of this technique. PCB 400 is comprised of, from top to bottom, top ground layer 402, internal signal layer 404, internal signal layer 406 and bottom ground layer 408. Ground layers 402 and 408 are on the top and bottom surfaces 400t and 400b of PCB 400. A mounting hole 410, shown as a through-hole, extends between the top and bottom surfaces 400t and 400b. Z-directed component 420 is shown flush mounted in PCB 400. Z-directed component 420 comprises body 422 having a center region 424 intermediate the top 422t and bottom 422b of body 422 and two side channels 425 and 427 on side surface 422s.

Side channels 425 and 427 and wall 411 of hole 410 form plating wells 413 and 415 respectively. Center region 424 is positioned within body 422 and extends a distance approximately equal to the distance separating the two internal signal layers 404 and 406. Side channel 425 extends from the bottom surface 422b of body 422 to internal signal level 406 while side channel 427 extends from top surface 422t of body 422 to internal signal level 404. Here, side channels 425 and 427 extend only along a portion of side surface 422s of body 422. Conductive channel 426 extends through center region 424 but does not extend to the top and bottom surfaces 422t, 422b of body 422. FIG. 5H illustrates a partial channel similar to side channel 427. Conductive channel 426 has conductive traces 428t and 428b extending from the top 426t and bottom 426b of conductive channel 426 to side channels 427 and 425, respectively. While illustrated as separate elements, conductive channel 426 and traces 428t, 428b may be one integrated conductor electrically interconnecting side channels 425, 427. As shown, conductive trace 428b is connected to internal signal layer 406 via plated side channel 425 and well 413 while trace 428t connects to internal signal level 404 via side channel 427 and well 415. Ground layers 402 and 408 are not connected to Z-directed component 420 and are spaced away from mounting hole 410 as previously described for FIGS. 8 and 10. As shown by double headed dashed arrow 430, a signal on signal layer 406 can be via'd to signal layer 404 (or vice versa) via Z-directed component 420 through a path extending from well 413, side channel 425, trace 428b, conductive channel 426, trace 428t, side channel 427, and well 415 to allow the signal to remain on the inner layers of PCB 400 with ground layers 402 and 408 providing shielding.

Z-Directed Decoupling Capacitors

Figure 12:
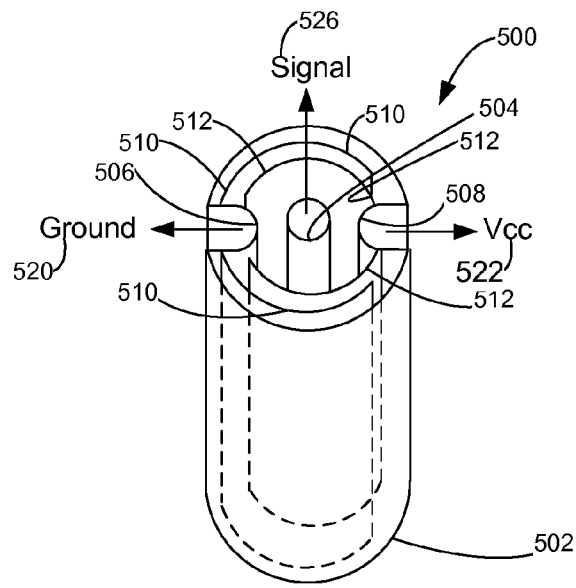
FIG. 12 is a perspective view of a Z-directed capacitor having semi-cylindrical sheets according to one example embodiment.
Figure 13:
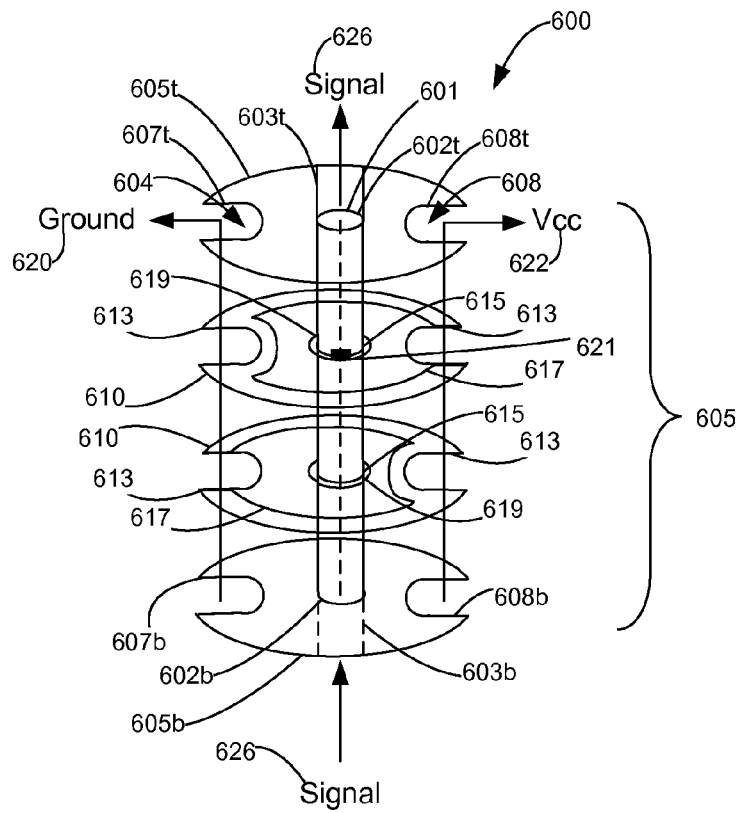
FIG. 13 is an exploded view of another embodiment of a Z-directed capacitor having stacked discs according to one example embodiment.

FIGS. 12 and 13 illustrate two additional example Z-directed components in the form of decoupling capacitors. In FIG. 12, a Z-directed capacitor 500 is shown with a body 502 having a conductive channel 504 and two side channels 506 and 508 extending along its length similar to those previously described. Conductive channel 504 is shown connected to a signal 526. Vertically oriented interleaved partial cylindrical sheets 510, 512 forming the plates of Z-directed capacitor 500 are connected to reference voltages such as voltage $V_{CC}$ and ground (or any other signals requiring capacitance) and are used with intervening layers of dielectric material (not shown). Partial cylindrical sheet 510 is connected to plated channel 506 which is connected to ground 520. Partial cylindrical sheet 512 is connected to plated channel 508 which is connected to supply voltage $V_{CC}$ 522. Sheets 510, 512 may be formed of copper, aluminum or other material with high conductivity. The material between the partial cylindrical sheets is a material with dielectric properties. Only one partial cylindrical sheet is shown connected to each of $V_{CC}$ 522 and ground 520; however, additional partial cylindrical sheets may be provided to achieve the desired capacitance/voltage rating.

Another embodiment of a Z-directed capacitor is shown in FIG. 13 using stacked support members connected to voltage $V_{cc}$ or ground. Z-directed capacitor 600 is comprised of center conductive channel 601 and a body 605 comprised of a top member 605t, a bottom member 605b, and a plurality of support members 610 (illustrated as disks) between the top and bottom members 605t, 605b.

Center conductive channel 601 extends through openings 615 in the assembled Z-directed capacitor 600 and openings 602t and 602b, all of which are sized to closely receive the center conductor. Center conductive channel 601 is electrically connectable to conductive traces 603t and 603b on the top and bottom portions 605t, 605b forming a signal path for signal 626. This connection is made by plating or soldering. Center conductive channel 601 is connected to signal 626 via conductive trace 603t. The bottom end of conductive channel 601 is connected in a similar fashion to a signal trace (not shown) via conductive trace 603b.

Opposed openings 607t and 608t are provided at the edge of top portion 605t. Bottom portion 605b is of similar construction as top portion 605t having opposed openings 607b and 608b provided at the edge. Between top and bottom portions 605t, 605b are a plurality of support members 610, which provide the capacitive feature. Support members 610 each have at least one opening 613 at their outer edge and an inner hole 615 allowing for passage of conductive channel 601 therethrough. As shown, two opposed openings 613 are provided in each support member 610. When assembled, the opposed openings 607t, 607b, 608t, 608b, and 613 align to form opposed side channels 604 and 608 extending along the side surface of Z-directed capacitor 600. Side channel 604 is shown connected to reference voltage such as ground 620 and side channel 606 to another reference voltage such as $V_{CC}$ 622. Support members 610 may be fabricated from a dielectric material and may be all of the same or varying thickness allowing for choice in designing the desired properties for Z-directed capacitor 600.

Annular plating 617 is provided on one of top and bottom surfaces of support member 610 or, if desired, on both surfaces. Annular plating is shown on the top surface of each support member but location of the annular plating can vary from support member to support member. Annular plating 617 generally conforms to the shape of the support member and extends from one of the edge openings 613 toward the other if an additional opening is provided. The annular plate 617 is of a diameter or dimension or overall size that is less than the diameter, dimension or overall size of support member 610 on which it is affixed. While the plate 617 is described as annular, other shapes may also be used provided that the plating does not contact the center conductive channel or extend to the edge of the support member on which it is plated or otherwise affixed. The annular plate does contact one of the edge openings 613 but is spaced apart from the other openings if more than one channel is present in the side surface of the body of Z-directed capacitor 600. Also, there is an opening 619 in annular plate 617 having a larger diameter than opening 615 in annular plate 617 through which conductive channel 601 passes. Opening 619 has a larger diameter than that of conductive channel 601 leaving annular plate 617 spaced apart from conductive channel 601.

As illustrated, the support members 610 are substantially identical except that when stacked, alternate members are rotated 180 degrees with respect to the member above or below it. This may be referred to as a 1-1 configuration. In this way, alternate members will be connected to one or the other of the two side channels. As shown in FIG. 13, the annular plating on the upper one of the two support members 610 is connected to side channel 608 and voltage $V_{CC}$ 622 while the annular plating on the lower one of the two support members 610 is connected to side channel 604 and ground 620. Other support member arrangements may also be used such as having two adjacent members connected to the same channel with the next support member being connected to the opposite channel which may be referred to as a 2-1 configuration. Other configurations may include 2-2, 3-1 and are a matter of design choice. The desired capacitance or voltage rating determines the number of support members that are inserted between top and bottom portions 605*t*, 605*b*. Although not shown, dielectric members comprised of dielectric material and similarly shaped to support members 610 may be interleaved with support members 610. Based on design choice, only a single channel may be used or more channels may be provided and/or the annular plating may be brought into contact with the center conductive channel and not in contact with the side channels. Again, the embodiments for Z-directed capacitors are for purposes of illustration and are not meant to be limiting.

With either design for a Z-directed capacitor, a second conductive channel may be provided in parallel with the first conductive channel that is disposed within the conductive plates to create a differential decoupling capacitor. Another embodiment of a Z-directed capacitor can be constructed from FIG. 12 or FIG. 13 by connecting the center conductive channel to one of the reference voltages at each support member that also has its annular plating connected to the same reference voltage. This may be accomplished simply by connecting the conductive channel to the annular plating as schematically illustrated by the jumper 621. In practice, the annular opening 619 in the annular plate 617 would be sized so that the annular plate and conductive channel 601 would be electrically connected. This component may be placed directly below a power pin or ball of an integrated circuit or other surface mounted component for optimum decoupling placement.

Again, the Z-directed signal pass-through components illustrated in FIGS. 8-11 and the Z-directed decoupling capacitors illustrated in FIGS. 12 and 13 provide merely a few example applications of a Z-directed component. Those skilled in the art will appreciate that various other types of Z-directed components may be utilized including, but not limited to, transmission lines, delay lines, T filters, decoupling capacitors, inductors, common mode chokes, resistors, differential pair pass throughs, differential ferrite beads, diodes, or ESD protection devices (varistors).

Continuous Extrusion Process for Manufacturing a Z-Directed Component

A continuous extrusion process for manufacturing the Z-directed components on a commercial scale is provided. In the continuous extrusion process, at least two different materials are extruded simultaneously to form the Z-directed component. This process is particularly useful where the materials forming the Z-directed component extend in a lengthwise direction within the component. As discussed above, a variety of different Z-directed components are contemplated herein. Accordingly, it will be appreciated that the specific materials used will depend on the Z-directed component desired. Signal paths will be formed from a conductive material. Resistive materials may also be used as desired. A dielectric material may be used that has a relative permittivity from about 3, e.g., polymers, to over 10,000, e.g., barium titanate ($BaTiO_3$). For example, a material with a relatively high dielectric value may be used in a Z-directed decoupling capacitor and a material with a relatively low dielectric value may be used in a Z-directed signal pass-through component. If a Z-directed component is desired to have an inductive function or a delay line then a ferrite material may be selected that has a low or high relative permeability with a range of about 1 to about 50,000.

Figure 14:
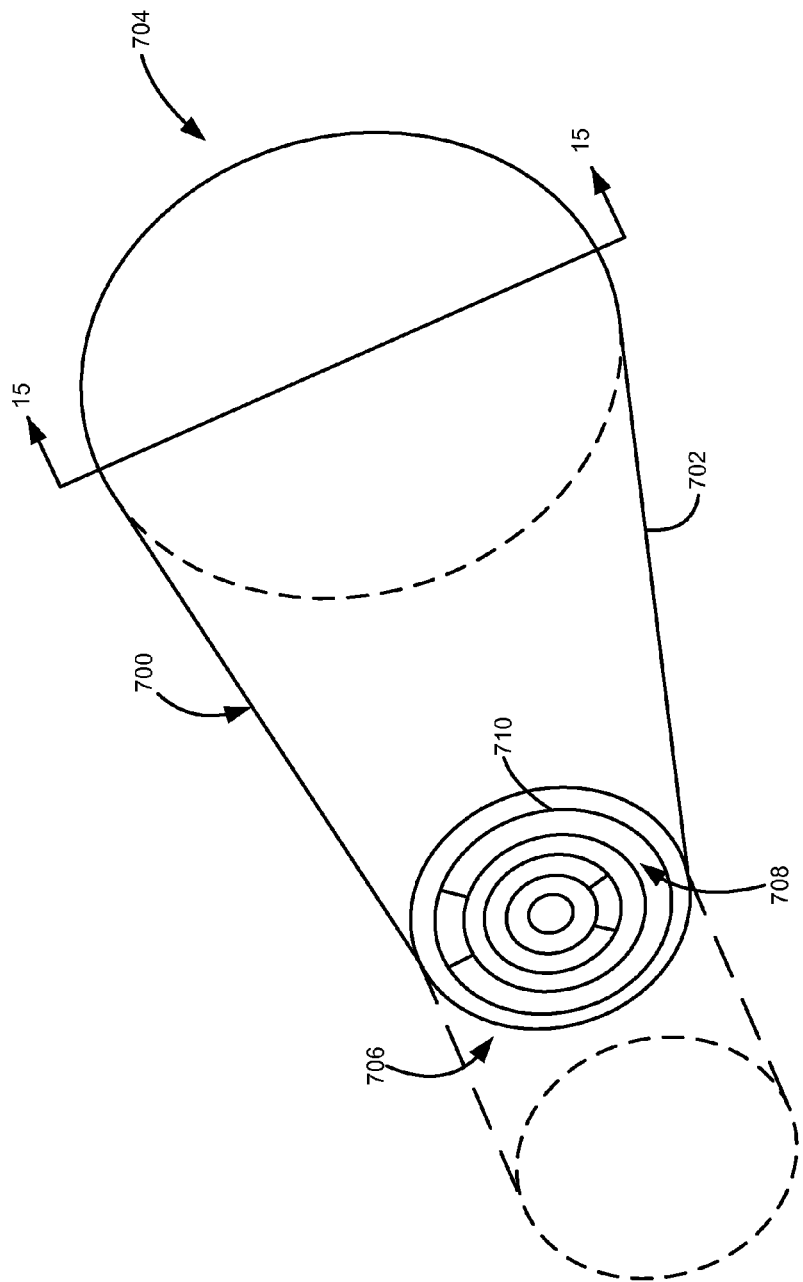
FIG. 14 is a schematic view of an extrusion die for forming a Z-directed component according to one example embodiment.

With reference to FIG. 14, an extrusion die 700 for forming a Z-directed component in the form of a decoupling capacitor according to one example embodiment is illustrated. The Z-directed capacitor formed from extrusion die 700 is composed of conductive material and dielectric material. As needed, a binder material may also be included as is known in the art. Extrusion die 700 includes a chamber 702 having an inlet 704 and an outlet 706 for passing material therethrough. Chamber 702 is divided into a plurality of channels 708 that are separated from one another by one or more barriers 710 to permit simultaneous extrusion of multiple materials. The channels 708 are arranged in predetermined positions that define the structure of the Z-directed component. In the example embodiment illustrated, a chamber 702 having a circular cross-section is used to form a generally cylindrical Z-directed component; however, as discussed above, many different shapes may be used.

The Z-directed component is formed by simultaneously forcing the desired materials into their corresponding channels 708 at inlet 704 of extrusion die 700, which causes the materials to take on the respective shapes of channels 708. The materials may be pressed into channels 708 using a ram, injection press or extruder screw (not shown). For example, a direct extrusion process may be used where extrusion die 700 is held stationary and the ram is moved towards it or an indirect extrusion process may be used where the ram is held stationary and extrusion die 700 is moved towards it. A combination of the two may be also used where the ram and die 700 are moved towards each other. A hydrostatic extrusion process may also be used where fluid pressure forces the materials through die 700. Extrusion die 700 may be oriented horizontally, vertically or at any suitable angle thereto. Any conventional drive may be applied to provide the extruding force including a mechanical or hydraulic drive. The desired materials are forced through die 700 in a continuous manner so that substantially an entire component (or more than one component) is extruded at once. Where more than one component is extruded at once, the extruded object exiting chamber 702 may then be divided into individual components as discussed in greater detail below.

Figure 15:
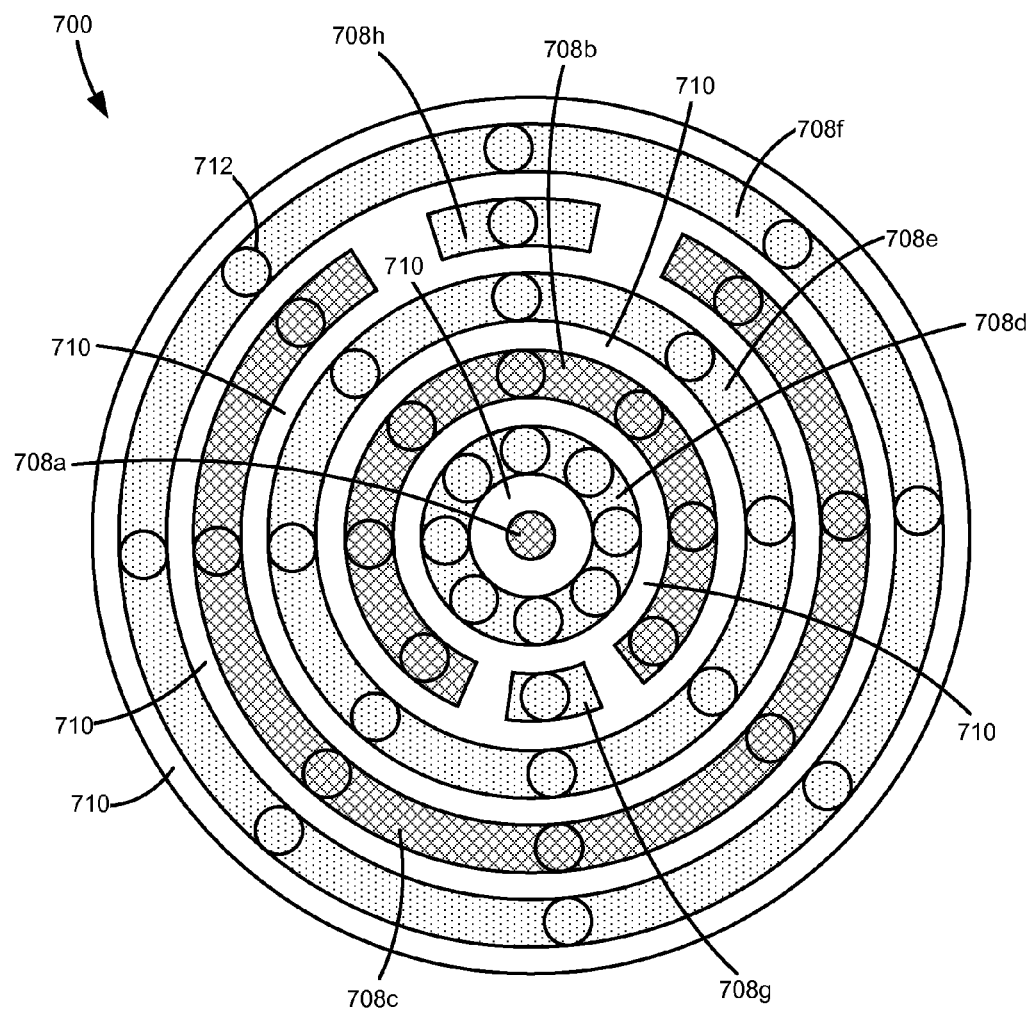
FIG. 15 is a cross-sectional view of the extrusion die shown in FIG. 14 showing a plurality of channels therein.

FIG. 15 shows a cross section of extrusion die 700 taken near inlet 704. In FIG. 15, the channels 708 that are filled with conductive material are indicated with a medium cross hatched fill and the channels 708 that are filled with dielectric material are indicated with a light dotted fill. Barriers 710 of extrusion die 700 are shown in cross-section without a fill. The small circles 712 shown in FIG. 15 indicate locations at inlet 704 where the desired materials may be pressed into chamber 702. The size and number of inlet ports 712 are selected to provide predetermined volumetric material flow rates through chamber 702. In the example embodiment illustrated, a center conductive channel in the Z-directed capacitor is formed in channel 708a. Channel 708a can also be used to form a signal trace, as desired. Two concentric conductive plates that surround the center conductive channel are formed in channels 708b and 708c. The conductive layers are isolated from each other by three layers of dielectric material. The dielectric layers are formed around each of the conductive layers in channels 708d, 708e and 708f. As discussed in greater detail below, a dielectric divider is formed in each of the concentric conductive plates to make a bridge path that will be used to connect alternating conductive traces on the top and/or bottom of the component. The dielectric dividers are formed by channels 708g and 708h in extrusion die 700.

As shown in FIG. 14, the diameter of chamber 702 reduces from inlet 704 to outlet 706. Each of the barriers 710 correspondingly tapers from inlet 704 to outlet 706 such that at a location near inlet 704 (shown in FIG. 15), barriers 710 are thicker than they are near outlet 706 (shown in FIG. 14). In this manner, the various materials are isolated from one another by barriers 710 when they are first introduced into chamber 702. Laminar flow is desired through chamber 702 in order to fill each channel 708 and form a substantially uniform part that is free of air gaps or other irregularities. The reduction in diameter of chamber 702 and the corresponding taper of barriers 710 cause the materials to fill their respective channels 708 and promote laminar flow therethrough. The reduction in diameter of chamber 702 and the corresponding taper of barriers 710 also urge the materials in the various channels 708 toward each other near outlet 706 to form a unitary part composed of multiple materials. After the various materials are combined (at the downstream end of barriers 710), in one embodiment, any remaining length of chamber 702 prior to outlet 706 has a constant diameter (as shown in dashed lines in FIG. 14) in order to maintain the shape of the extruded object and the relative positions of the various materials therein. Alternatively, the diameter of chamber 702 may continue to narrow in order to shrink the component to its final dimensions so long as the positioning of the various materials making up the component relative to each other is not disturbed. A movable element, such as a plug or rod, may be used to support the downstream end of the extruded object as it advances to help prevent it from losing its shape. For instance, where the extrusion process is performed in a vertically downward direction, a plug that lowers according to the speed of extrusion may be used to support the extruded object from below to maintain the shape of the extruded object.

After the materials have been extruded to form the desired shape and configuration of the Z-directed component, if desired, before proceeding with any remaining steps the extruded object can be partially fired in order to improve the strength of the materials and to ensure that the component will remain intact. Moderate heat may also be applied to cure the binder material. Heating elements can be embedded into the walls of a chamber downstream from the extrusion output, which may either be attached to the extrusion die or form a unitary part of the extrusion die, in order to supply a desired temperature profile to the extruded object. Alternatively, rather than applying moderate heat to cure the binder material or partially fire the extruded object, a full firing process may be performed at this time.

Figure 16:
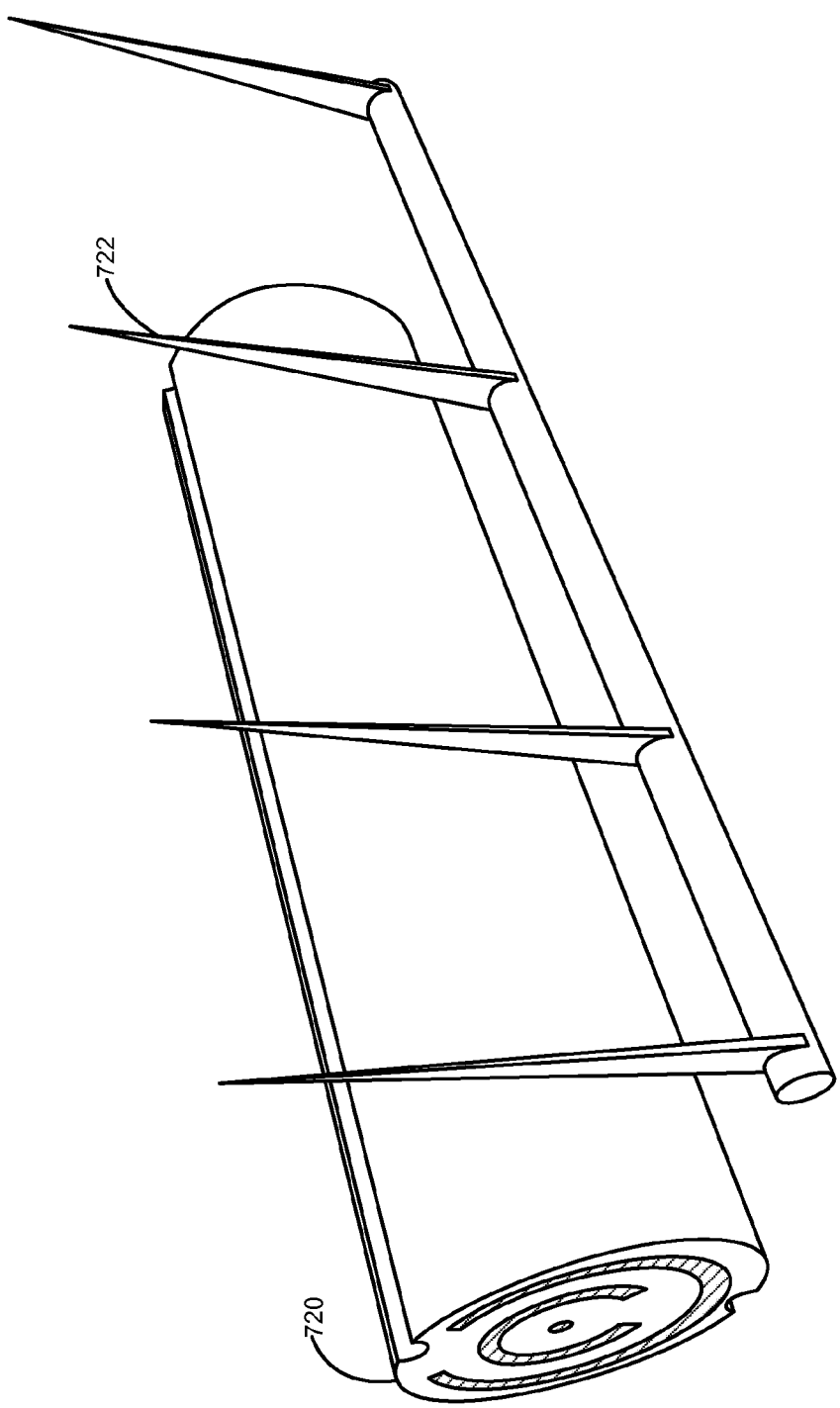
FIG. 16 is a perspective view of a series of blades for dividing an extruded object formed from the extrusion die shown in FIG. 14 into individual Z-directed components according to one example embodiment.

After extrusion, in one embodiment, the extruded object is divided into individual Z-directed components according to the desired length(s) of the Z-directed component(s). FIG. 16 shows a segment of an extruded object 720 ready to be cut. One option is to use a series of blades 722 spaced according to the desired component lengths. In one embodiment, the components range in length from about 0.5 mil to about 62 mil (about 0.0127 mm to about 1.57 mm), including all increments and values therebetween, depending on the PCB used and the desired mounting position of the Z-directed component. Another option is to cut the extruded object 720 using multiple passes of a single blade. In this embodiment, the length of each component is determined by controlling the timing of each pass of the blade. Each component may have substantially the same length or different lengths may be used. A feedback mechanism may be used to adjust the timing of the cuts in order to account for parameters that may change with blade usage, such as the kerf of the blade. The extruded object may be in an unfired, a partially fired or a fully fired state when it is divided into separate components. It will be appreciated that a partially fired state is preferred. When extruded object 720 is cut in an unfired state, it may be difficult to ensure that extruded object 720 will retain its shape. When extruded object 720 is fully fired when it is cut, it will take more force to perform the cut with a very hard cutting tool such as, for example, a diamond cutting tool as is known in the art. As an alternative to extruding the components in bulk and then dividing the extruded object into individual components, each Z-directed component may be extruded individually. However, this may still require each extruded component to be cut to its precise length.

Figure 17:
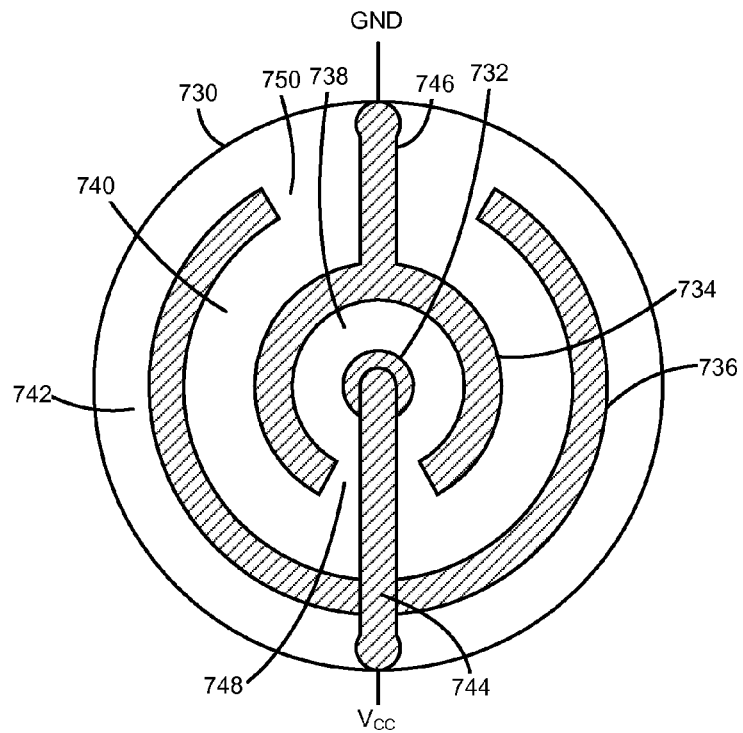
FIG. 17 is a top plan view of a Z-directed capacitor formed from the extrusion die shown in FIG. 14.

FIG. 17 shows a top plan view of a Z-directed capacitor 730 formed using the example extrusion die 700 shown in FIGS. 14 and 15. In FIG. 17, the diagonal hatching indicates those areas that are composed of conductive material. The remainder of the component is composed of dielectric material. Capacitor 730 includes a center conductor 732 running lengthwise through the part that is formed by channel 708a. Capacitor 730 also includes a pair of concentric conductive plates 734, 736 spaced radially from conductor 732 running lengthwise through the part that are formed by channels 708b, 708c, respectively. Three concentric layers 738, 740, 742 of dielectric formed by channels 708d, 708e, 708f, respectively, isolate conductors 732, 734, 736 from each other. After the component is cut from the extruded object, a conductive trace 744 is added to a top and/or bottom surface of capacitor 730 that connects center conductor 732 to outer conductive plate 736 and to an edge of the part to provide a connection with a corresponding trace on the PCB. Trace 744 passes through a dielectric divider 748 formed by channel 708g in order to avoid connection with middle conductive plate 734. Similarly, a conductive trace 746 is added to connect middle conductive plate 734 to an edge of the capacitor 730 to provide a connection with another trace on the PCB. Trace 746 passes through a dielectric divider 750 formed by channel 708f in order to avoid connection with outer conductive plate 736. In one embodiment, center conductor 732 and outer conductive plate 736 are connected to a supply voltage $V_{CC}$ and middle conductive plate 734 is connected to ground voltage GND although this configuration can be reversed as desired. Traces 744, 746 can be applied when the Z-directed component is fabricated or after the Z-directed component is inserted into the mounting hole in the PCB when the PCB is plated.

Figure 18:
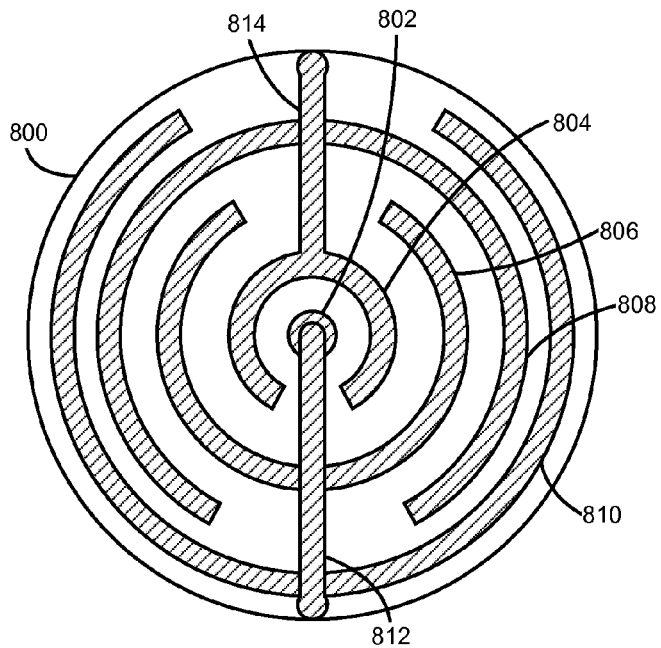
FIG. 18 is a top plan view of a Z-directed capacitor according to another example embodiment.

It will be appreciated that the Z-directed capacitor may have any number of conductive plates depending on the desired capacitance of the part. For example, FIG. 18 shows a Z-directed capacitor 800 having a center conductor 802 and four concentric conductive plates 804, 806, 808, 810 spaced outwardly therefrom. Trace 812 is formed on a top surface of capacitor 800 that connects center conductor 802 and conductive plates 806 and 810 to an edge of the part for connection with a trace on the PCB. Trace 814 is formed on the top surface of capacitor 800 that connects conductive plates 804 and 808 to an edge of capacitor 800 for connection with the PCB. As discussed above with respect to FIG. 17, dielectric material isolates center conductor 802 and conductive plates 804, 806, 808, 810 from each other and creates a bridge for traces 812, 814. It will be appreciated that the number and arrangement of conductive and dielectric layers may be altered simply by changing the configuration of the extrusion die used.

Figure 19:
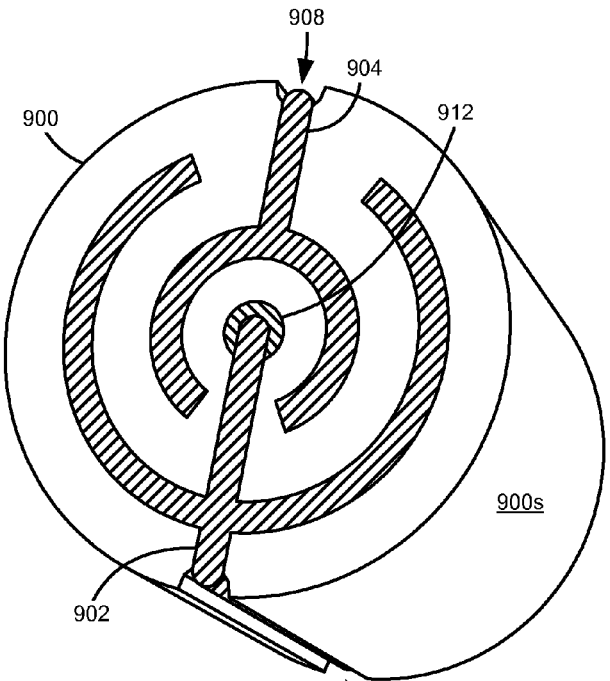
FIG. 19 is a perspective view of a Z-directed capacitor having a pair of radial conductive traces that extend lengthwise through the part according to one example embodiment.

In another alternative, the conductive connections to the PCB, such as traces 744, 746 shown in FIG. 17 or traces 812, 814 shown in FIG. 18, are extruded within the part. For example, FIG. 19 shows a Z-directed capacitor 900 that has a similar layout to Z-directed capacitor 700 shown in FIG. 17 except that radial conductive traces 902, 904 extend through the length of the part. In this embodiment, traces 902, 904 are formed by altering the configuration of the channels in the extrusion die so that traces 902, 904 are extruded within the part. Traces 902, 904 are each positioned in a respective side channel 906, 908 in capacitor 900. In order to form side channels 906, 908, an extrusion die that features a corresponding pair of inwardly projecting scalloped portions is used instead of a cylindrical die. As shown in FIG. 19, traces 902, 904 are exposed on a side surface 900s of capacitor 900 along the entire length of the part. As a result, traces 902, 904 may be used to establish a connection not only with the top or bottom surface of the PCB but also an intermediate layer of the PCB as desired. By extruding the conductive connections to the PCB within the component, in some embodiments, a separate step adding conductive traces for connection to the PCB may be eliminated.

In some embodiments, a thin film resist layer is added to a top and/or bottom surface of the component in order to prevent plating material from interfering with the conductive paths present on the top or bottom surface of the Z-directed component when the PCB is plated. In this configuration, the connection between the component and the PCB may be made by plating side channels, such as side channels 906, 908, of the Z-directed component and connecting them to a trace on the PCB rather than using a trace on the top or bottom surface of the component.

Figure 20:
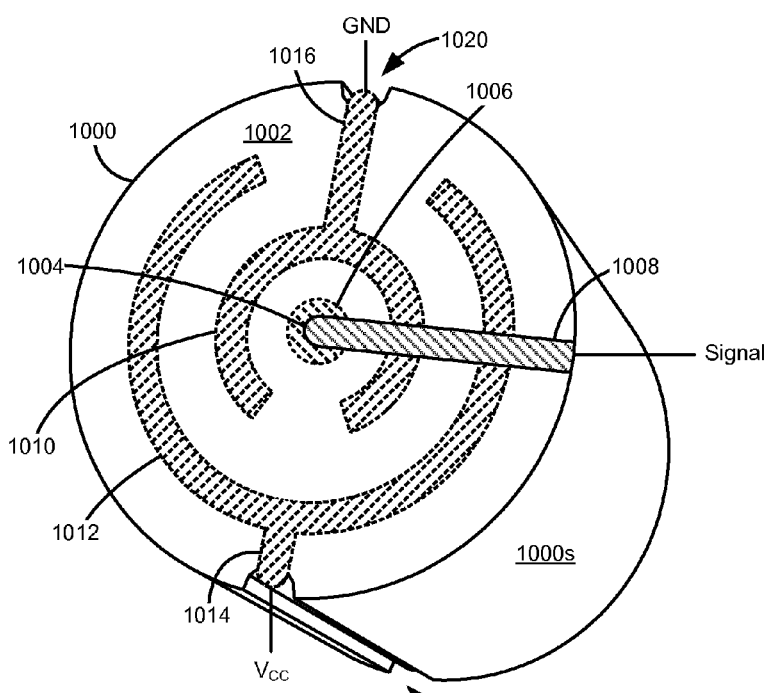
FIG. 20 is a perspective view of a Z-directed capacitor having a thin film insulator applied to a top surface thereof and a conductive trace applied on top of the thin film insulator according to one example embodiment.

It will be appreciated that any number of isolated conductors could be extruded to make through board connections of a PCB. For example, in the example Z-directed capacitor shown in FIG. 19, it may be desired to pass a signal through a center conductor 912 rather than supply voltage $V_{CC}$ or ground GND. In order to accomplish this, a layer of thin film insulator may be screened on the top and/or bottom surface of the Z-directed component. For example, FIG. 20 illustrates a Z-directed capacitor 1000 having a thin film insulator 1002 screened across a top surface thereof. In the example embodiment illustrated, the film is screened such that a small hole 1004 is provided in insulator 1002 in order to permit plating to a center conductor 1006 that extends the length of capacitor 1000. A conductive trace 1008 is applied across insulator 1002 that connects center conductor 1006 to an edge of the part. Trace 1008 from center conductor 1006 can be applied when the Z-directed component is fabricated or after the Z-directed component is inserted into the mounting hole in the PCB when the PCB is plated. Capacitor 1000 also includes a pair of concentric conductive plates 1010, 1012 extruded through the part. In this embodiment, center conductor 1006 is isolated from concentric conductive plates 1010, 1012 by dielectric material. Conductive traces 1014, 1016 also extend through the length of the part and are exposed along a side surface 1000s of capacitor 1000 in side channels 1018, 1020, respectively. Traces 1014, 1016 extend radially from and connect conductive plates 1010, 1012, respectively, to an edge of the component. Conductive plates 1010, 1012 and the radial portions of traces 1014, 1016 are covered on the top surface of the part by insulator 1002 and are therefore shown in dashed lines. In this manner, insulator 1002 prevents the signal (Signal) sent to center conductor 1006 via trace 1008 from shorting either the supply voltage ($V_{CC}$) or the ground (GND). Trace 1008 can be connected to a corresponding trace on a top surface of the PCB and traces 1014, 1016 can be connected to the PCB anywhere along side surface 1000s of capacitor 1000.

Figure 21:
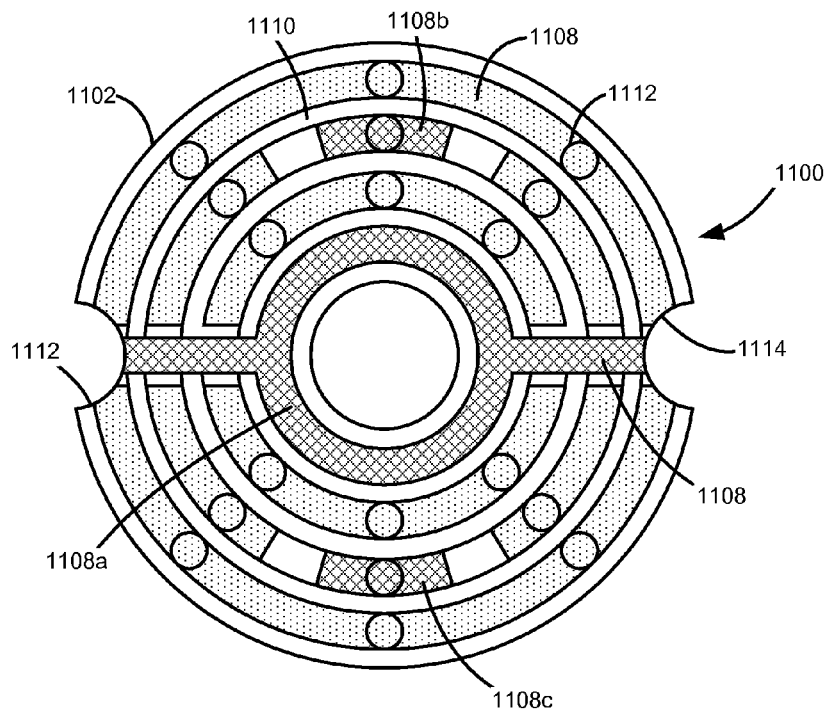
FIG. 21 is a cross-sectional view of an extrusion die for forming a Z-directed transmission line or delay line according to one example embodiment.

FIG. 21 illustrates a cross-section of another example extrusion die 1100 for forming a Z-directed transmission line or delay line. Die 1100 includes a plurality of channels 1108 therein separated by barriers 1110. The same fill convention used in FIG. 14 is used in FIG. 21. Specifically, the channels 1108 that are filled with conductive material are indicated with a medium cross hatched fill and the channels 1108 that are filled with dielectric material are indicated with a light dotted fill. Barriers 1110 of extrusion die 1100 are shown without a fill. The small circles 1112 shown in FIG. 21 indicate locations where the desired materials may be pressed into a chamber 1102 of die 1100. In this embodiment, die 1100 includes a pair of inwardly projecting scalloped portions 1112, 1114 for forming a corresponding pair of side channels in the component. Die 1100 includes a channel 1108a for forming a conductor through the length of the component that includes a circular portion having radial connections to each of the side channels. Die 1100 also includes a pair of channels 1108b, 1108c for forming a corresponding pair of conductors through the Z-directed component.

Figure 22:
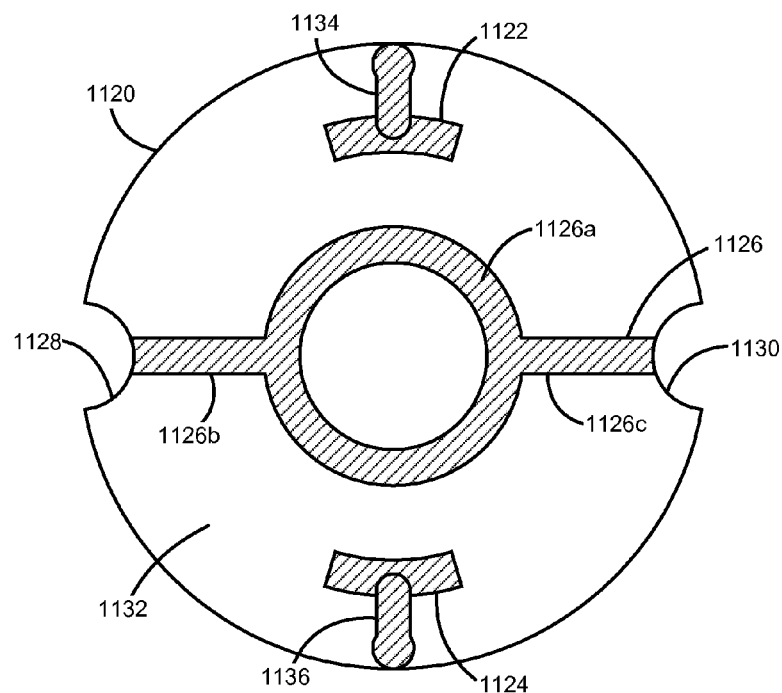
FIG. 22 is a top plan view of a Z-directed differential transmission line formed from the extrusion die shown in FIG. 21.

FIG. 22 shows a top plan view of a Z-directed differential transmission line 1120 formed using extrusion die 1100 shown in FIG. 21. The same fill convention used in FIG. 17 is used in FIG. 22. The diagonal hatching in FIG. 22 indicates those areas that are composed of conductive material. The remainder of the component is composed of dielectric material. Transmission line 1120 includes a pair of conductors 1122, 1124 formed from channels 1108b, 1108c, respectively, that run lengthwise through the part. Transmission line 1120 also includes a ground (or reference) conductor 1126 having a circular portion 1126a and a pair of radial extensions 1126b, 1126c that connect to corresponding side channels 1128, 1130 in the part. Conductor 1126 is formed by channel 1108a of extrusion die 1100. Side channels 1128, 1130 are formed by scalloped portions 1112, 1114, respectively. Conductors 1122, 1124, 1126 are separated from each other by a dielectric material 1132 such as ceramic. Conductive traces 1134, 1136 are applied to the top surface of the component to provide a connection for conductor 1122, 1124. Conductors 1122, 1124 form a differential pair. Since transmission line 1120 includes a reference conductor 1126, the two differential signals are not highly coupled. However, conductor 1126 could be replaced with the dielectric material and the differential signals would become highly coupled.

Figure 23B:
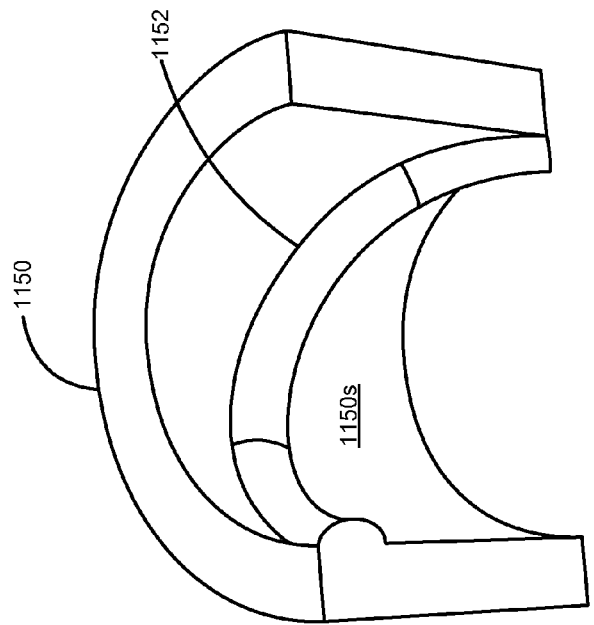
FIG. 23B is a cutaway view of the spiral tool shown in FIG. 23A further illustrating one of the spiraling projections.
Figure 23A:
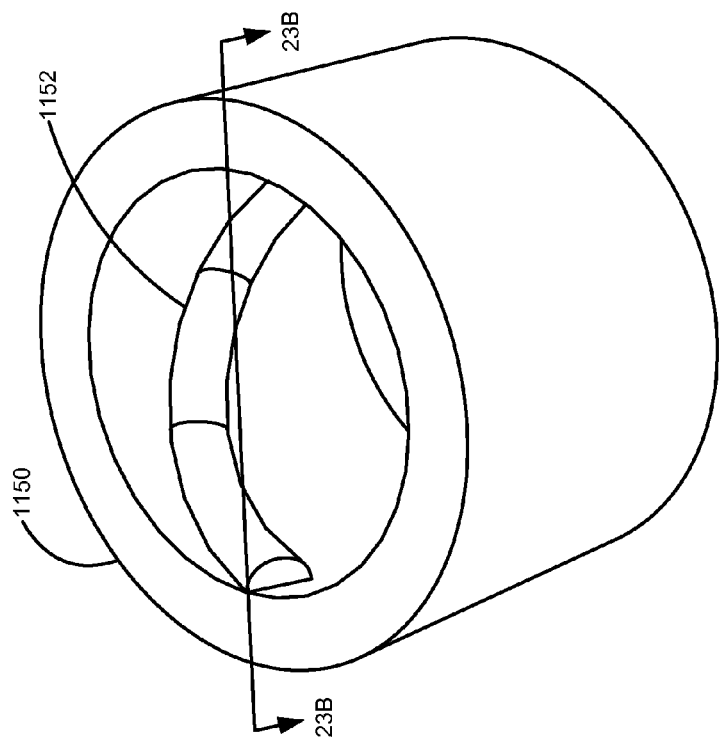
FIG. 23A is a perspective view of a spiral tool having spiraling projections that extend from an inner surface thereof according to one example embodiment.

With reference to FIGS. 23A and 23B, if it is desired to delay the signals through transmission line 1120, the extruded object may be forced through a spiral tool 1150 that lengthens the path of conductors 1122, 1124 relative to the length of the component. Spiral tool 1150 includes a pair of spiraling projections 1152 that extend from an inner surface 1150s thereof. FIG. 23B illustrates a cross-section of spiral tool 1150 that more clearly illustrates one of the projections 1152 therein. As the extruded object is forced through spiral tool 1150, projections 1152 form corresponding side channels in the component and cause the extruded object to twist as it advances. This causes conductors 1122, 1124 to twist into a double helix configuration. Again, center conductor 1126 can be omitted as desired.

Spiral tool 1150 can be used to alter the relative positions of corresponding traces on the top and bottom surfaces of the component such that a trace on the top surface of the component can be angled with respect to a corresponding trace on the bottom surface of the component. It will be appreciated that spiral tool 1150 can also be used to create an inductor. For instance, a single conductor, such as conductor 1122 or conductor 1124 can be formed in a twisted pattern that can be used as a single wire inductor. In this embodiment, the remainder of the Z-directed component will be composed of a material having a relatively high permeability. Where two conductors, such as conductors 1122, 1124, are used in a double helix configuration, a transformer can be formed. In this embodiment, by driving current through one of the conductors 1122 or 1124 (the primary coil), energy is magnetically coupled to the second conductor (the secondary coil) as an output.

Figure 24:
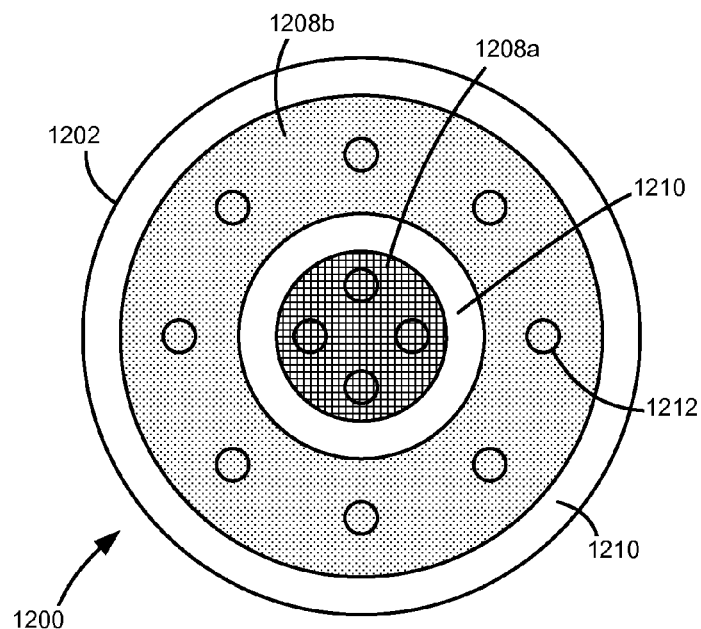
FIG. 24 is a cross-sectional view of an extrusion die for forming a Z-directed resistor according to one example embodiment.

FIG. 24 illustrates a cross-section of another example extrusion die 1200 for forming a Z-directed resistor. Die 1200 includes a plurality of channels 1208 therein separated by barriers 1210. The same fill convention used in FIGS. 14 and 21 is used in FIG. 24. Specifically, the channel 1208 that is filled with dielectric material is indicated with a light dotted fill. The channel 1208 that is filled with resistive material is indicated with a heavy cross hatched fill. Barriers 1210 of extrusion die 1200 are shown without a fill. The small circles 1212 shown in FIG. 24 indicate locations where the desired materials may be pressed into a chamber 1202 of die 1200. Die 1200 includes a channel 1208a for forming a resistive path through the length of the component and a channel 1208b for providing dielectric material around the resistive path.

Figure 25:
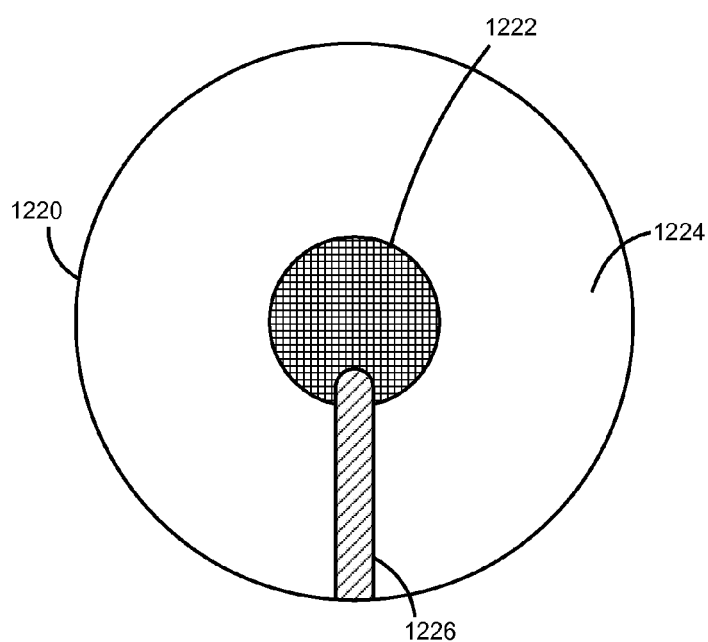
FIG. 25 is a top plan view of a Z-directed resistor formed from the extrusion die shown in FIG. 24.

FIG. 25 shows a top plan view of a Z-directed resistor 1220 formed using extrusion die 1200 shown in FIG. 24. The same fill convention used in FIGS. 17 and 22 is used in FIG. 25. The diagonal hatching in FIG. 22 indicates those areas that are composed of conductive material. The heavy crossed hatching indicates those areas that are composed of resistive material. The remainder of the component is composed of dielectric material. Resistor 1220 includes a resistive path 1222 that runs lengthwise through the part formed by channel 1208a. Dielectric material 1224, such as ceramic, formed by channel 1208b surrounds resistive path 1222. Conductive trace 1226 is applied to the top and/or bottom surface of the component to provide a connection to resistive path 1222. It will be appreciated that the resistance imparted by resistor 1220 may be altered as desired by changing the diameter of channel 1208a in die 1200 in order to correspondingly alter the diameter of resistive path 1222.

Figure 26:
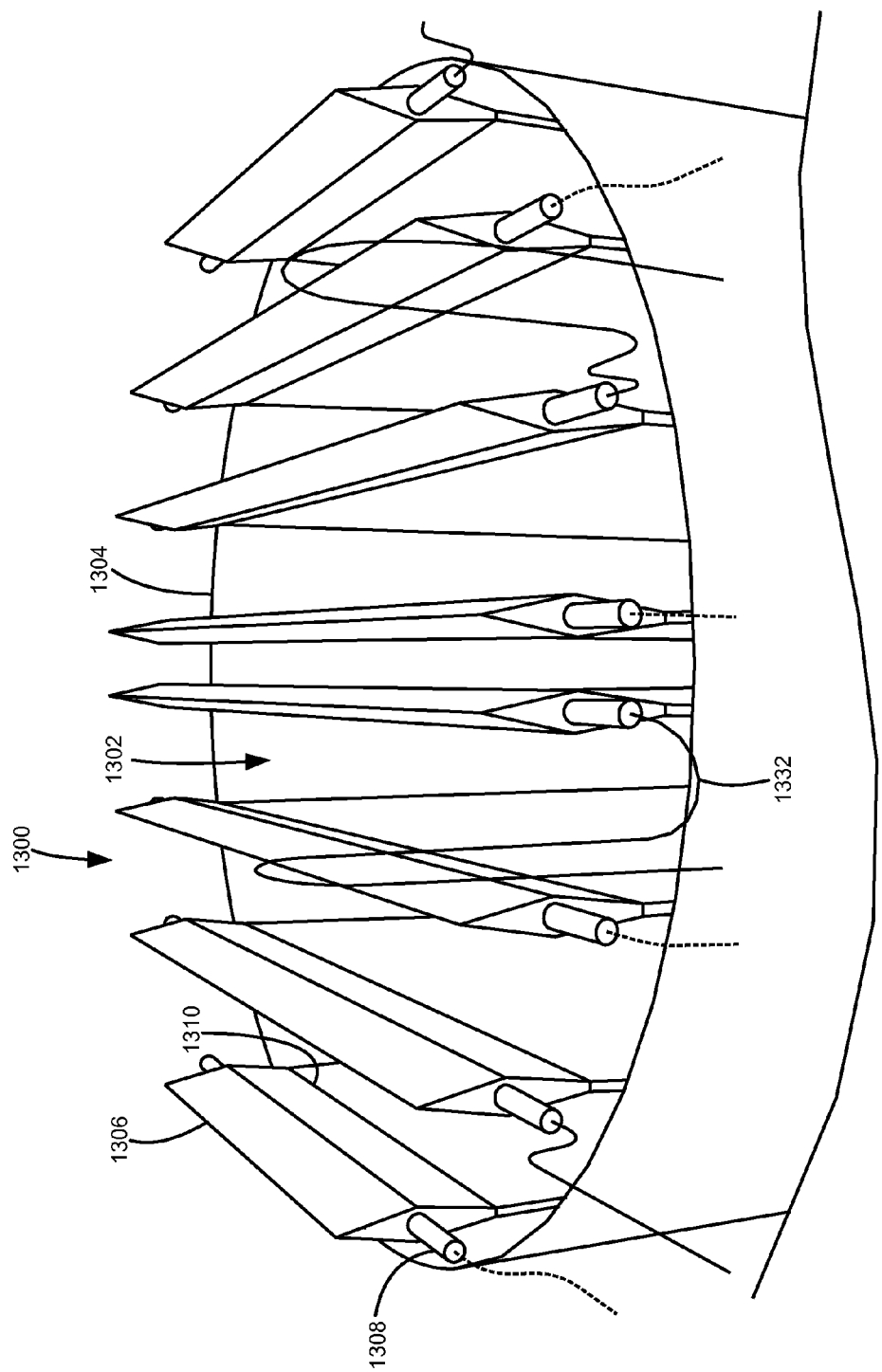
FIG. 26 is a perspective view of an extrusion die for forming a Z-directed alternating plate capacitor according to one example embodiment.
Figure 27:
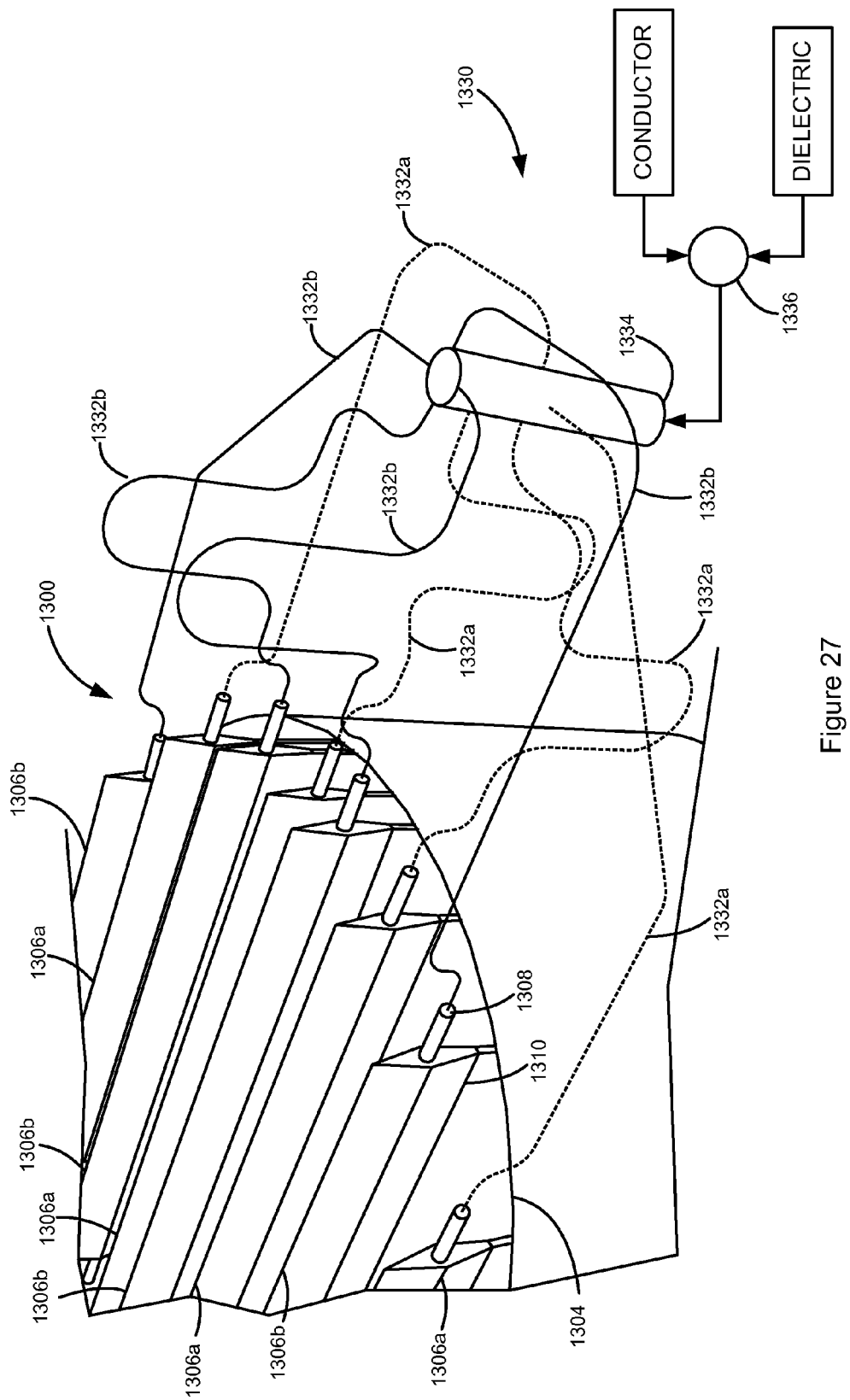
FIG. 27 is a perspective view of the extrusion die shown in FIG. 26 schematically depicting a delivery system for delivering materials to the extrusion die.

With reference to FIGS. 26 and 27, an extrusion die 1300 for forming an alternating plate capacitor according to one example embodiment is shown. In this embodiment, the timing of extrusion of the various materials is varied in order to stagger them within the Z-directed component. Extrusion die 1300 includes a chamber 1302 having an inlet 1304 and an outlet (not shown). A plurality of slats 1306 are positioned at inlet 1304 or downstream therefrom. Each slat 1306 includes an inlet 1308 that receives material from a supply source through a corresponding pipe or tube 1332.

Each slat 1306 also includes an outlet 1310 that emits material into die 1300 in the downstream direction of extrusion, which is downward in the embodiment shown in FIGS. 26 and 27. One or more materials is supplied to the inlet 1308 of each slat 1306 by a delivery system 1330 that includes a switch to control which material is being emitted by a particular slat 1306.

Figure 28:
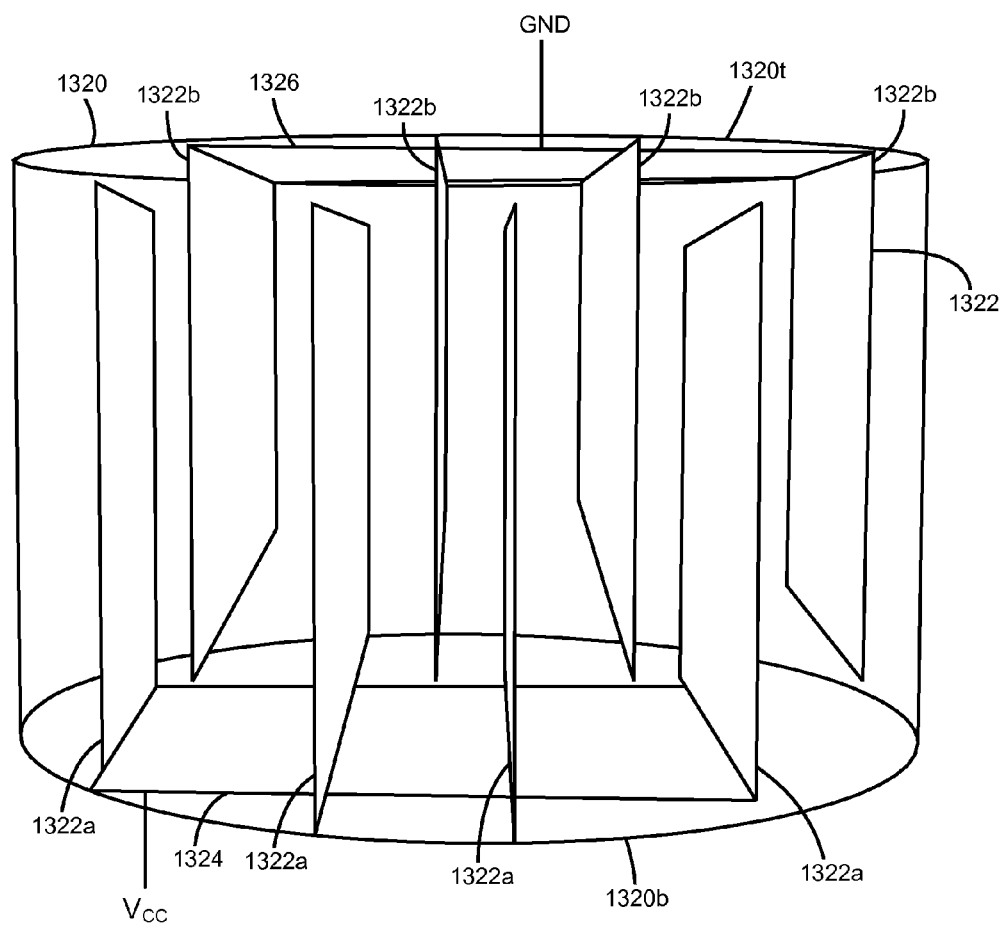
FIG. 28 is a transparent perspective view of a Z-directed alternating plate capacitor formed from the extrusion die shown in FIGS. 26 and 27.

FIG. 28 shows a Z-directed alternating plate capacitor 1320 formed using the example extrusion die 1300 shown in FIGS. 26 and 27 as discussed in greater detail below. In order to more clearly illustrate the internal structure of capacitor 1320, capacitor 1320 is shown with a transparent body in FIG. 28. Capacitor 1320 includes a plurality of conductive plates 1322 extending lengthwise within the component. Plates 1322 are divided into two sets 1322a, 1322b that are spaced from each other in an alternating relationship. Each of the first set 1322a of plates 1322 extends to a bottom surface 1320b of capacitor 1320 but is spaced from a top surface 1320t thereof. Conversely, each of the second set 1322b of plates 1322 extends to top surface 1320t but is spaced from bottom surface 1320b. The body of capacitor 1320 is formed from dielectric material. Capacitor 1320 includes a first conductive trace 1324 along bottom surface 1320b that connects with each of the first set 1322a of plates 1322 but not the second set 1322b of plates 1322 and a second conductive trace 1326 along top surface 1320t that connects with each of the second set 1322b of plates 1322 but not the first set 1322a of plates 1322. In one embodiment, trace 1324 and first set 1322a of plates 1322 are connected to a supply voltage $V_{CC}$ and trace 1326 and second set 1322b of plates 1322 are connected to ground voltage GND although this configuration can be reversed as desired.

With reference to FIGS. 27 and 28, to form alternating plate capacitor 1320 shown in FIG. 28, slats 1306 are disposed relative to chamber 1302 according to the desired positions of conductive plates 1322. Dielectric material is forced into inlet 1304 of chamber 1302 and around slats 1306. As the dielectric material flows around slats 1306, either conductive material or additional dielectric material is dispensed from outlets 1310 of slats 1306 depending on whether the slat 1306 corresponds with one of the first set 1322a of plates 1322 or the second set 1322b of plates 1322. Specifically, a first set 1306a of slats 1306 corresponds with first set 1322a of plates 1322 and a second set 1306b of slats 1306 corresponds with second set 1322b of plates 1322.

As shown in FIG. 27, tubes 1332 of delivery system 1330 are divided into two sets 1332a, 1332b. For ease of illustration, first set 1332a of tubes 1332 is shown in dashed lines and second set 1332b is shown in solid lines. First set 1332a of tubes 1332 supplies material to first set 1306a of slats 1306, which corresponds with first set 1322a of plates 1322. Second set 1332b of tubes 1332 supplies material to second set 1306b of slats 1306, which corresponds with second set 1322b of plates 1322. In this embodiment, each tube 1332 has substantially the same length. Both sets 1332a, 1332b of tubes 1332 receive material from a manifold 1334. A valve 1336, such as a three-port valve (e.g., an L-shaped three-way ball valve), determines whether conductive material, dielectric material or neither is supplied to manifold 1334. As shown in FIG. 27, each of the first set 1332a of tubes 1332 is connected to a portion of manifold 1334 that is upstream from the connection between manifold 1334 and second set 1332b of tubes 1332. This causes first set 1332a of tubes 1332 to receive material before second set 1332b does. As a result, when valve 1336 switches from one material to another (e.g., from dielectric to conductor or vice versa), first set 1306a of slats 1306 receives the new material before second set 1306b of slats 1306 does thereby creating the desired stagger between sets 1322a, 1322b of plates 1322. Because tubes 1332 are all the same length, first set 1306a of slats 1306 emits material into chamber 1302 in unison and then, after the delay that results from the respective placement of tubes 1332 on manifold 1334 expires, second set 1306b of slats 1306 emits the same material in unison to create the staggered pattern of plates 1322 shown in FIG. 28. Specifically, first set 1306a of slats 1306 first emits conductive material so that the corresponding first set 1322a of conductive plates 1322 extends to bottom surface 1320b of the part until the end of extrusion is near at which point first set 1306a of slats 1306 switches to dielectric material so that the plates 1322 are spaced from top surface 1320t. Conversely, as a result of the delay imposed by manifold 1334, second set 1306b of slats 1306 first emits dielectric material so that the corresponding second set 1322b of conductive plates 1322 are spaced from bottom surface 1320b of the part and then, when the delay expires, second set 1306b of slats 1306 switches to conductive material so that the plate 1322 extends to top surface 1320t.

After the component is formed, conductive traces 1324, 1326 are added to top and bottom surfaces, respectively, as discussed above. Traces 1324, 1326 can be applied when the Z-directed component is fabricated or after the Z-directed component is inserted into the mounting hole in the PCB when the PCB is plated.

The arrangement shown in FIG. 27 is intended to provide an example of a suitable configuration for creating the desired material delay and resulting stagger between plates 1322. It will be appreciated that a number of different configurations of tubes 1332, valves 1336 and manifolds 1334 may be used to facilitate material flow into each slat 1306 and that the timing of material flow and/or the lengths of the material paths may be adjusted to create the desired delay. One alternative is to use a valve 1336 and corresponding manifold 1334 specific to each set 1306a, 1306b of slats 1306. In this embodiment, the stagger between plates 1322 can be created by setting a delay between the valve 1336 for first set 1306a of slats 1306 and the valve 1336 for second set 1306b of slats 1306. Another option is to provide each slat 1306 with its own valve 1336 and feedpath from the sources of conductive material and dielectric material and to control each slat 1306 individually. Yet another option to create the desired stagger between plates 1322 is to position one set of slats 1306, such as first set 1306a, upstream from another set, such as second set 1306b, and to dispense material from each slat at the same time.

Figure 29A:
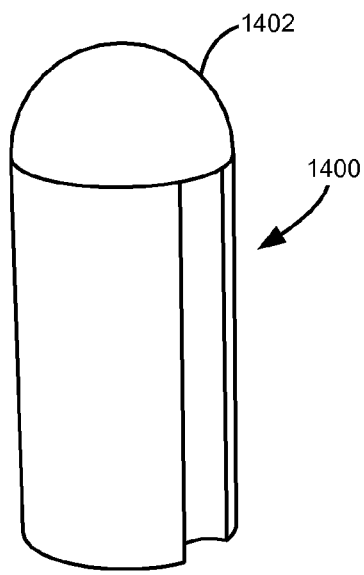
FIG. 29A is a perspective view of a Z-directed component having a dome formed on an end thereof according to one example embodiment.
Figure 29B:
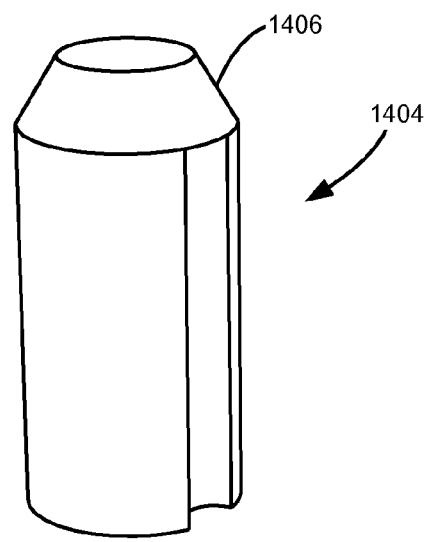
FIG. 29B is a perspective view of a Z-directed component having a chamfered end according to one example embodiment.

In some embodiments, a chamfer, dome or other form of taper or lead-in of at least one of the top and bottom edge of the Z-directed component is desired in order to ease insertion of the Z-directed component into the mounting hole in the PCB. For example, FIG. 29A shows a Z-directed component 1400 having a dome 1402 formed on an end thereof. FIG. 29B shows a Z-directed component 1404 having a chamfered end 1406. The dome 1402 or chamfer 1406 may be part of the component or attached thereto. In one embodiment, the dome 1402 or chamfer 1406 is a separate part that is partially inserted into the mounting hole in the PCB. In this embodiment, the Z-directed component is then inserted behind the dome 1402 or chamfer 1406 to push it through the mounting hole causing the dome 1402 or chamfer 1406 to expand the mounting hole and prevent the component from cutting or tearing the PCB. Where the dome 1402 or chamfer 1406 is attached to the Z-directed component, it may be configured to remain attached to the Z-directed component following insertion into the mounting hole in the PCB or it may be used to facilitate insertion and then removed.

Figure 30:
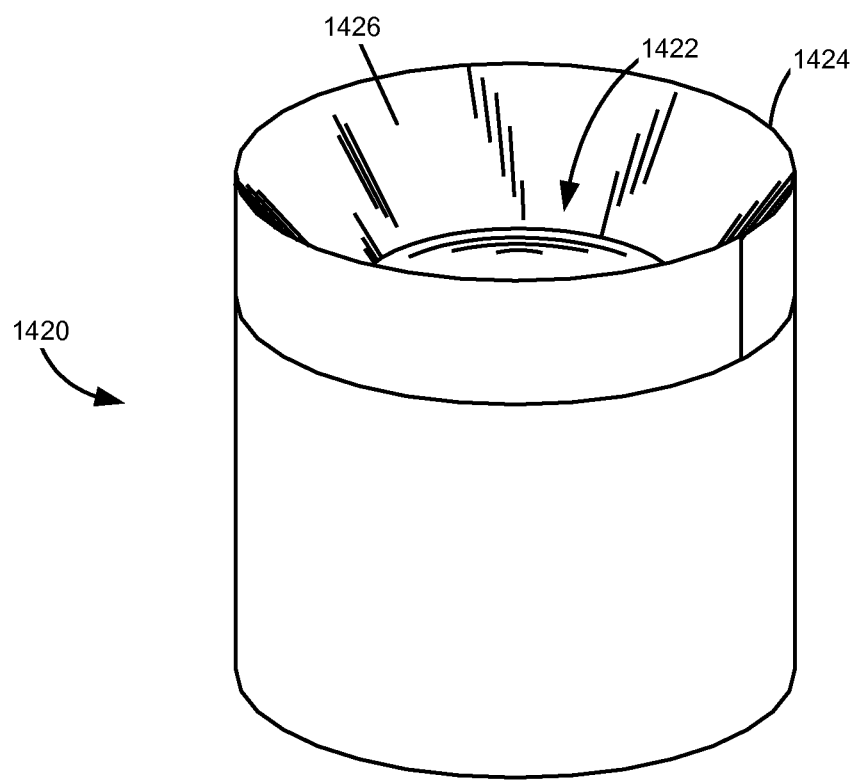
FIG. 30 is a perspective view of a plug for forming a taper in an end of a Z-directed component according to one example embodiment.

One method for forming the desired taper as part of the Z-directed component utilizes a plug 1420 having a recess 1422 formed in an end 1424 thereof having a tapered rim 1426 around a periphery of recess 1422 as shown in FIG. 30. Tapered rim 1426 is chamfered in the example embodiment illustrated; however, a domed, elliptical or rounded rim may also be used depending on the shape of the taper desired. Plug 1420 is used to compress the component in a constraining plate having a cavity for retaining the component therein. When plug 1420 applies a force to an end of the component, the end of the part is reflowed to have the desired geometry and the conductive path(s) on the end of the part are allowed to continue across or through the corresponding taper formed on the end of the part. As a result, the tapered end portion of the part can then be used to facilitate board to board electrical connections in multi-PCB applications.

After the Z-directed component has been formed, a firing process is applied to cure the part if it has not been done so already. The firing process solidifies the part and shrinks it to its final dimensions. At this point, the Z-directed component can be tested for yield and performance and any additional processes may be performed as desired. For example, in some instances, the heating step may cause burrs to form. Accordingly, in some embodiments, the Z-directed components are tumbled with various abrasive agents to smooth the corners and edges of the part. Further, resist areas may be added to the Z-directed component to keep the conductive materials from sticking to areas that are not intended to be conductive. Glue areas may be applied to the component to assist with retaining it in the PCB. Visible markings and/or locating features may be added to the Z-directed component to assist with assembly into the PCB.

Once production of the Z-directed component is complete, it is ready to be inserted into the mounting hole of the PCB. As discussed above, the component may be mounted normal to the plane of the PCB from the top or bottom surfaces or both surfaces, mounted at an angle thereto or inserted into the edge of the PCB between the top and bottom surfaces of the PCB. In some embodiments, the Z-directed component is press fit into the mounting hole. This press fit may be in the form of an interference fit between the component and the mounting hole. After the Z-directed component is positioned in the mounting hole, a conductive plating bridge may be applied to connect one or more traces on the top and/or bottom surface of the component to a corresponding trace on the PCB. Further, where the Z-directed component includes side channels therein, additional conductive plating may be applied to these side channels to form the desired signal connections between the Z-directed component and the PCB.

Figure 31:
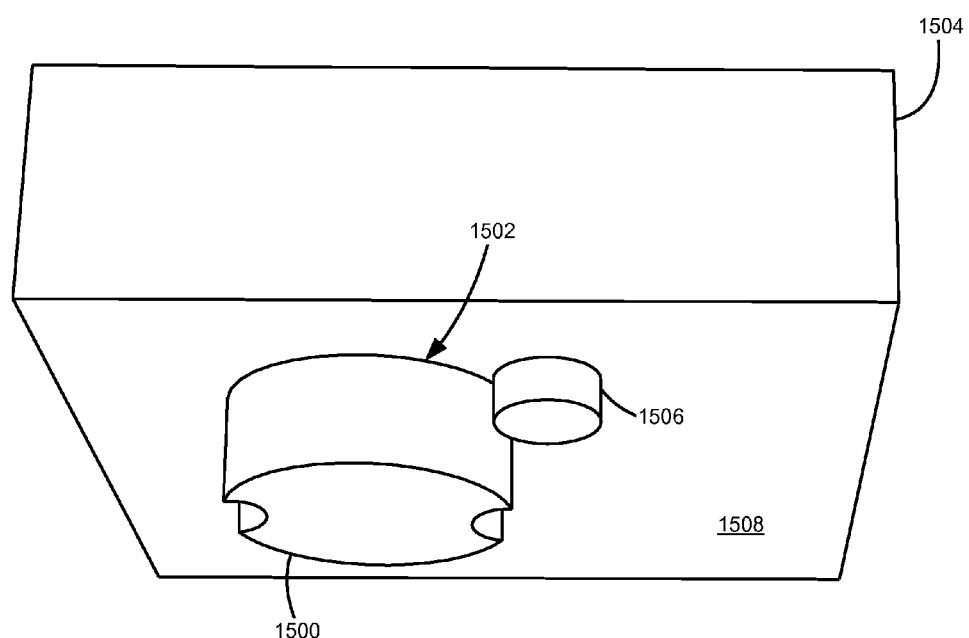
FIG. 31 is a perspective view of a bottom surface of a PCB having an adhesive applied thereto in contact with a side surface of a Z-directed component inserted into a mounting hole in the PCB according to one example embodiment.

With reference to FIG. 31, in one embodiment, after a Z-directed component 1500 is inserted into a mounting hole 1502 in a PCB 1504, an adhesive 1506 is applied to a surface 1508 of PCB 1504 external to mounting hole 1502. Adhesive 1506 is positioned to contact a surface of Z-directed component 1500 when it is inserted into mounting hole 1502 in order to fix the location of Z-directed component 1500 and prevent it from rotating or translating out of position.

Figure 32A:
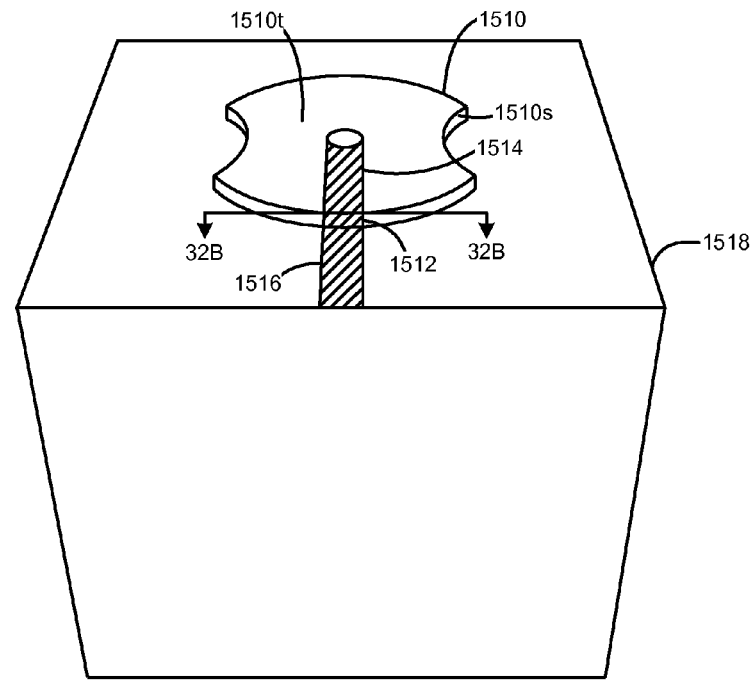
FIG. 32A is a perspective view of a Z-directed component inserted into a mounting hole in a PCB, the Z-directed component having a conductive strip applied to a side surface thereof according to one example embodiment.
Figure 32B:
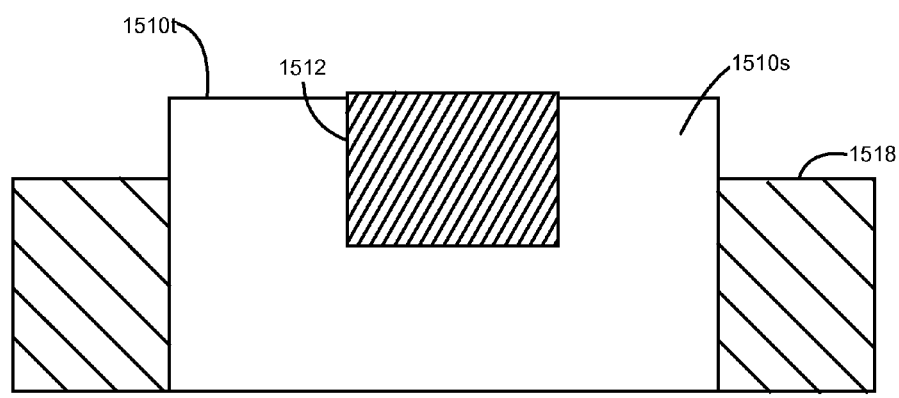
FIG. 32B is a side cutaway view of the Z-directed component and PCB shown in FIG. 32A.

With reference to FIGS. 32A and 32B, manufacturing variations in the thickness of the PCB and the length of the Z-directed component may prevent the Z-directed component from being perfectly flush with both the top and bottom surfaces of the PCB. As a result, in one embodiment, a conductive strip 1512 is formed along a side surface 1510s of a Z-directed component 1510. Conductive strip 1512 runs along side surface 1510s to either the top or bottom surface of Z-directed component 1510. Conductive strip 1512 may be applied after the Z-directed component 1510 is formed. In the example embodiment illustrated, conductive strip 1512 runs along side surface 1510s to a top surface 1510t of Z-directed component 1510. In this manner, conductive strip 1512 forms a bridge between a trace 1514 on the respective top or bottom surface of Z-directed component 1510 and a trace 1516 on a PCB 1518 when the top or bottom surface of the Z-directed component extends past the corresponding top or bottom surface of the PCB. As a result, trace 1514 on Z-directed component 1510 is able to connect to trace 1516 on PCB 1518 even if the top or bottom surface of Z-directed component 1510 is not flush with the corresponding top or bottom surface of PCB 1518. In the example configuration illustrated in FIG. 32B, conductive strip 1512 runs from top surface 1510t of Z-directed component 1510 to a point along side surface 1510s that is below the top surface of the PCB 1518. In one embodiment, conductive strip 1512 extends into the side of Z-directed component 1510 both to decrease its resistance and to ensure that it is not removed if another feature such as a taper is later applied to Z-directed component 1510.

The foregoing description of several embodiments has been presented for purposes of illustration. It is not intended to be exhaustive or to limit the application to the precise forms disclosed, and obviously many modifications and variations are possible in light of the above teaching. It is understood that the invention may be practiced in ways other than as specifically set forth herein without departing from the scope of the invention. It is intended that the scope of the application be defined by the claims appended hereto.

The invention claimed is:

1. A method for manufacturing a Z-directed component for insertion into a mounting hole in a printed circuit board, comprising:
    simultaneously extruding a plurality of materials in the cross-sectional shape of the Z-directed component to form an extruded object with the plurality of materials arranged relative to each other in their operative positions for electrical function of the Z-directed component; and
    curing at least a segment of the extruded object, the cured segment forming the Z-directed component insertable into a mounting hole in a printed circuit board,
    wherein said extruding the plurality of materials in the cross-sectional shape of the Z-directed component includes forcing the plurality of materials through a chamber of an extrusion die to form the extruded object, a portion of the chamber including a barrier that separates different materials from each other and defines the positions of the materials relative to each other.

2. The method of claim 1, wherein said extruding the plurality of materials in the cross-sectional shape of the Z-directed component includes extruding the plurality of materials in a lengthwise direction of the Z-directed component.

3. The method of claim 2, wherein the plurality of materials extend lengthwise through substantially the entire extruded object.

4. The method of claim 1, wherein a diameter of the chamber and a thickness of the barrier narrow in a downstream direction of extrusion.

5. The method of claim 1, wherein said curing at least a segment of the extruded object includes separating a segment from the extruded object and curing the separated segment.

6. The method of claim 1, wherein one of the plurality of extruded materials is a conductive material that forms a conductive channel in the Z-directed component.

7. The method of claim 6, further comprising applying a conductive trace to one of a top surface and a bottom surface of the Z-directed component that connects with the conductive channel to provide an interconnection between the conductive channel and a trace on the printed circuit board.

8. The method of claim 6, wherein the extruded conductive material extends to a side surface of the Z-directed component to provide an interconnection between the conductive channel and a trace on the printed circuit board.

9. The method of claim 6, further comprising applying a layer of insulator on one of a top surface and a bottom surface of the Z-directed component to protect a portion of the extruded conductive material that is exposed at the respective top or bottom surface of the Z-directed component.

10. The method of claim 6, further comprising twisting the extruded object while forcing the extruded object through the chamber to cause the conductive channel to spiral in the Z-directed component.

11. The method of claim 1, further comprising compressing the Z-directed component with a plug that includes a recess formed in an end thereof having a tapered rim around a periphery of the recess to form a corresponding taper in one of a top surface and a bottom surface of the Z-directed component.

* * * * *